US012696537B2

(12) United States Patent
Kim

(10) Patent No.: US 12,696,537 B2
(45) Date of Patent: Jul. 28, 2026

(54) SEMICONDUCTOR DEVICES COMPRISING A LOWER STRUCTURE, A BARRIER LAYER, AND AN UPPER STRUCTURE

(71) Applicant: Samsung Electronics Co., Ltd., Suwon-si (KR)

(72) Inventor: Jinbum Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 379 days.

(21) Appl. No.: 18/458,447

(22) Filed: Aug. 30, 2023

(65) Prior Publication Data

US 2024/0266350 A1     Aug. 8, 2024

(30) Foreign Application Priority Data

Feb. 6, 2023     (KR) ........................ 10-2023-0015676

(51) Int. Cl.
H10D 84/85     (2025.01)
H10D 30/01     (2025.01)
(Continued)

(52) U.S. Cl.
CPC ......... H10D 84/856 (2025.01); H10D 30/014 (2025.01); H10D 30/43 (2025.01); (Continued)

(58) Field of Classification Search
CPC ............. H10D 84/0167; H10D 84/017; H10D 84/038; H10D 88/01; H10D 30/6757; (Continued)

(56) References Cited

U.S. PATENT DOCUMENTS 10,192,867 B1     1/2019   Frougier et al.
10,522,419 B2    12/2019   Ando et al.
(Continued)

FOREIGN PATENT DOCUMENTS

CN          115566021 A   *  1/2023    ......... H10D 84/0193
CN          115692198 A      2/2023

OTHER PUBLICATIONS

English translation for CN-115566021-A (Year: 2023).*
Extended European Search Report dated Apr. 15, 2024 for corresponding European Application No. 23204610.2.

*Primary Examiner* — William B Partridge
*Assistant Examiner* — David Paul Sedorook
(74) *Attorney, Agent, or Firm* — Harness, Dickey & Pierce, P.L.C.

(57)          ABSTRACT

A semiconductor device includes a lower structure; a barrier layer on the lower structure; and an upper structure on the barrier layer, wherein the lower structure includes lower source/drain regions; lower active layers spaced apart from each other, between the lower source/drain regions; and a lower gate structure and including portions below each of the lower active layers, wherein the upper structure includes upper source/drain regions and vertically overlapping the lower source/drain regions; upper active layers spaced apart from each other, between the upper source/drain regions, and vertically overlapping the lower active layers; and an upper gate structure, including portions on each of the upper active layers, and vertically overlapping the lower gate structure, and wherein the uppermost lower active layer of the lower active layers and the lowermost upper active layer of the upper active layers are in contact with the barrier layer.

19 Claims, 33 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 88/00* | (2026.01) |

(52) U.S. Cl.
CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 88/01* (2025.01)

(58) Field of Classification Search
CPC .............. H10D 30/797; H10D 62/822; H10D 84/0142; H10D 84/0151; H10D 84/0179; H10D 88/00; H10D 84/0165; H10D 62/151; H10D 64/256
See application file for complete search history.

(56) References Cited

U.S. PATENT DOCUMENTS

| | | | | |
|---|---|---|---|---|
| 11,069,684 | B1 * | 7/2021 | Xie | ................... H01L 21/02603 |
| 11,164,793 | B2 | 11/2021 | Xie et al. | |
| 11,201,153 | B2 | 12/2021 | Xie et al. | |
| 11,374,003 | B2 | 6/2022 | Wu et al. | |
| 2015/0187940 | A1 * | 7/2015 | Huang | ................. H10D 62/115 |
| | | | | 438/296 |
| 2018/0337176 | A1 * | 11/2018 | Lee | ...................... H10D 30/024 |
| 2019/0378901 | A1 * | 12/2019 | Yu | ......................... H10D 84/834 |
| 2021/0273098 | A1 * | 9/2021 | Chang | ................. H10D 84/856 |
| 2021/0320035 | A1 | 10/2021 | Xie et al. | |
| 2022/0052203 | A1 | 2/2022 | More | |
| 2023/0062940 | A1 | 3/2023 | Khaderbad et al. | |
| 2023/0066265 | A1 | 3/2023 | Chen et al. | |

* cited by examiner

SEMICONDUCTOR DEVICES COMPRISING A LOWER STRUCTURE, A BARRIER LAYER, AND AN UPPER STRUCTURE

CROSS-REFERENCE TO RELATED APPLICATION(S)

This application claims the benefit of priority to Korean Patent Application No. 10-2023-0015676 filed on Feb. 6, 2023 in the Korean Intellectual Property Office, the disclosure of which is incorporated herein by reference in its entirety.

BACKGROUND

Example embodiments of the present disclosure relate to semiconductor devices.

In answer to demands for high integration and miniaturization of a semiconductor device, a size of a semiconductor device has been miniaturized. Accordingly, a semiconductor device including a stacked transistor such as a complementary field effect transistor (CFET) stack has been introduced to reduce a corresponding area compared to an area of a corresponding non-stacked device.

SUMMARY

Some example embodiments of the present disclosure are to provide semiconductor devices having improved electrical properties and reliability.

According to some example embodiments of the present disclosure, a semiconductor device includes a lower structure; a barrier layer on the lower structure; and an upper structure on the barrier layer, wherein the lower structure includes lower source/drain regions spaced apart from each other in a first direction; lower active layers spaced apart from each other in a vertical direction, between the lower source/drain regions, and connected to the lower source/drain regions; and a lower gate structure extending in a second direction perpendicular to the first direction and including portions below each of the lower active layers, wherein the upper structure includes upper source/drain regions spaced apart from each other in a first direction and vertically overlapping the lower source/drain regions; upper active layers spaced apart from each other in the vertical direction, between the upper source/drain regions, connected to the upper source/drain regions, and vertically overlapping the lower active layers; and an upper gate structure extending in the second direction, including portions on each of the upper active layers, and vertically overlapping the lower gate structure, and wherein the uppermost lower active layer of the lower active layers and the lowermost upper active layer of the upper active layers are in contact with the barrier layer.

According to some example embodiments of the present disclosure, a semiconductor device includes a first structure; a barrier layer on the first structure; and a second structure on the barrier layer, wherein the first structure includes first source/drain regions spaced apart from each other in a first direction; first channel layers spaced apart from each other in a vertical direction, between the first source/drain regions, and connected to the first source/drain regions; and a first gate structure extending in a second direction perpendicular to the first direction and including portions below the first channel layers, respectively, wherein the second structure includes second source/drain regions spaced apart from each other in the first direction; second channel layers spaced apart from each other in the vertical direction, between the second source/drain regions, and connected to the second source/drain regions; and a second gate structure extending in the second direction and including portions on the second channel layers, respectively, wherein the barrier layer includes a first portion between an uppermost first channel layer among the first channel layers and a lowermost second channel layer among the second channel layers, and a second portion extending from the first portion to a region between the first source/drain regions and the second source/drain regions, and wherein at least one of the upper surface and the lower surface of the second portion has a curved shape.

According to some example embodiments of the present disclosure, a semiconductor device includes lower channel layers and upper channel layers stacked in a vertical direction; lower source/drain regions spaced apart from each other on a first level; upper source/drain regions spaced apart from each other on a second level higher than the first level; lower channel layers between the lower source/drain regions and spaced apart from each other in a vertical direction; upper channel layers between the upper source/drain regions and spaced apart from each other in the vertical direction; a barrier layer between an uppermost lower channel layer of the lower channel layers and a lowermost upper channel layer of the upper channel layers, and between the lower source/drain regions and the upper source/drain regions; a lower gate structure below the barrier layer and extending by covering an upper surface, a side surface, and a lower surface of at least one of the lower channel layers; an upper gate structure on the barrier layer and extending by covering an upper surface, a side surface, and a lower surface of at least one of the upper channel layers; a lower contact structure below the lower source/drain regions and electrically connected to the lower source/drain regions; and an upper contact structure on the upper source/drain regions and electrically connected to the upper source/drain regions.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, example embodiments of the present disclosure will be described as follows with reference to the accompanying drawings.

Figure 1:
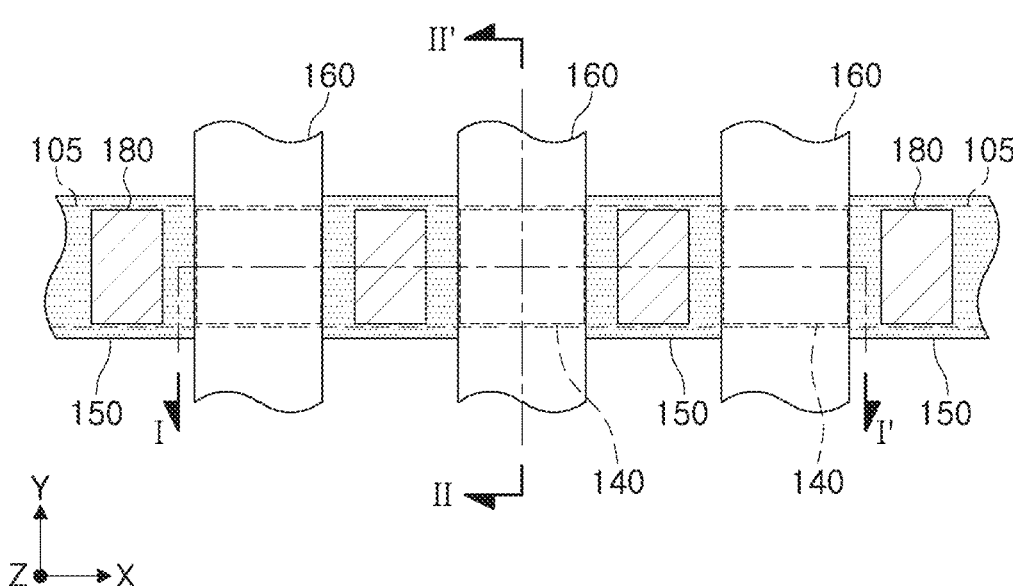
FIG. 1 is a plan diagram illustrating a semiconductor device according to some example embodiments of the present disclosure.

FIG. 1 is a plan diagram illustrating a semiconductor device according to some example embodiments.

Figure 2A:
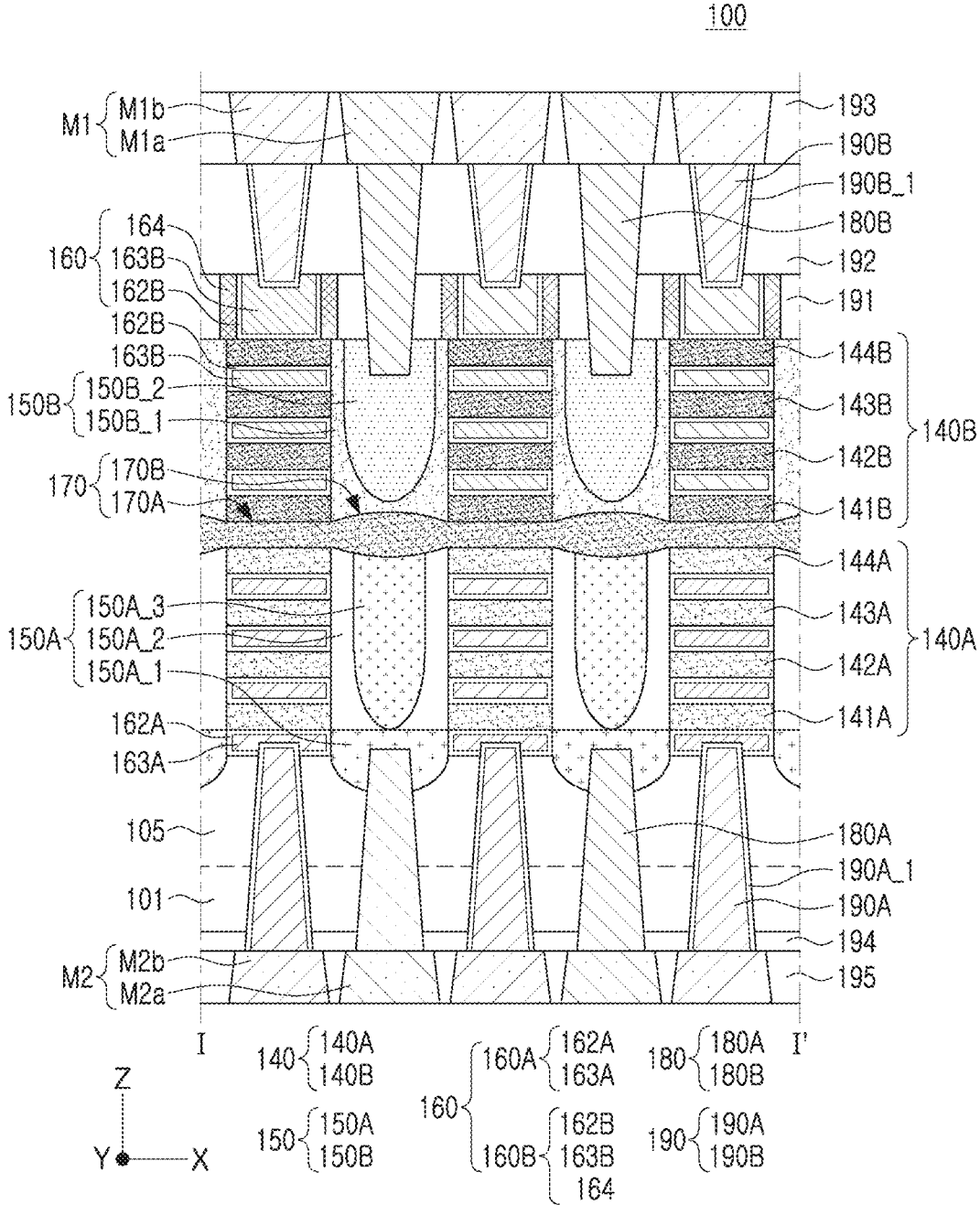
FIGS. 2A and 2B are cross-sectional diagrams illustrating a semiconductor device according to some example embodiments of the present disclosure.
Figure 2B:
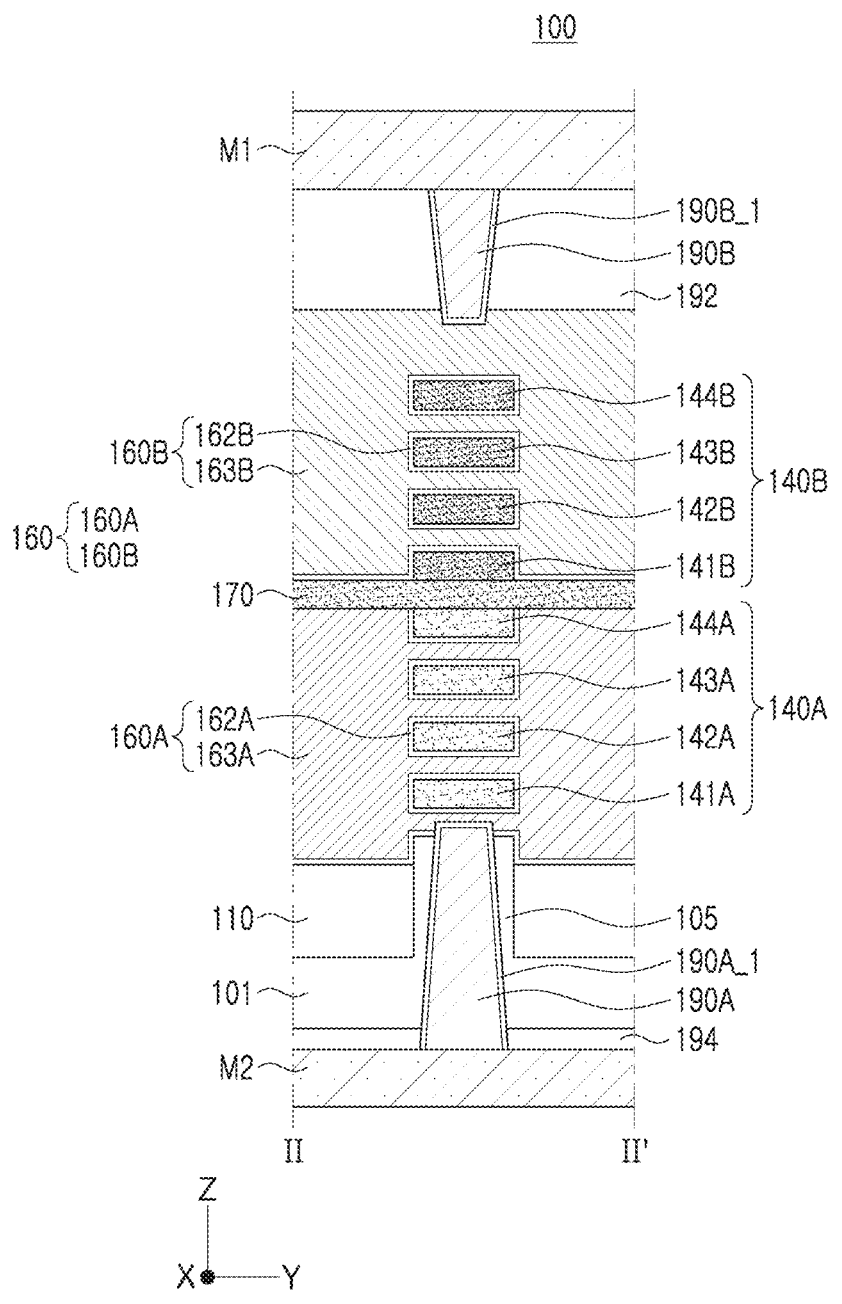

FIGS. 2A and 2B are cross-sectional diagrams illustrating a semiconductor device in some example embodiments, taken along line I-I' and II-II' in FIG. 1. For ease of description, only a portion of components of a semiconductor device are illustrated in FIG. 1.

Referring to FIGS. 1 to 2B, a semiconductor device 100 may include a lower structure, a barrier layer 170 on the lower structure, and an upper structure on the barrier layer 170. The semiconductor device 100 further may include a contact structure 180, a gate contact structure 190, first to fifth interlayer insulating layers 191, 192, 193, 194, and 195, and first and second wirings M1 and M2.

In some example embodiments, the terms "first structure" and "second structure" may be referred to as "lower structure" and "upper structure," respectively, "first gate structure," "first channel layers," "first source/drain regions," and "first contact structure" may be referred to as "lower gate structure," "lower channel layers," "lower source/drain regions," and "lower contact structure," respectively, and "second gate structure" structure," "second channel layers," "second source/drain regions," and "second contact structure" may be referred to as "upper gate structure," "upper channel layers," "upper source/drain regions," and "upper contact structure", respectively.

The lower structure may include a substrate 101 including an active region 105 extending in the first direction X, a lower gate structure 160A intersecting the active region 105 and extending in the second direction Y on the substrate 101, lower channel layers 140A spaced apart from each other in the third direction Z perpendicular to an upper surface of the substrate 101 and surrounded by a lower gate structure 160A on the active region 105, and lower source/drain regions 150A disposed on the active region 105 on at least one side of the lower gate structure 160A and connected to the lower channel layers 140A.

The upper structure may include an upper gate structure 160B disposed on the lower gate structure 160A and the barrier layer 170, intersecting the active region 105 on the substrate 101, and extending in the second direction Y, upper channel layers 140B spaced apart from each other in the third direction Z and disposed to be surrounded by an upper gate structure 160B on the active region 105, and upper source/drain regions 150B disposed on at least one side of the upper channel layers 140B on the active region 105 and the barrier layer 170 and connected to the upper channel layers 140B.

The substrate 101 may have an upper surface extending in X and Y-directions. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, or a semiconductor on insulator (SeOI) layer.

The device isolation layer 110 may define an active region 105 in the substrate 101. The device isolation layer 110 may be formed by, for example, a shallow trench isolation (STI) process. The device isolation layer 110 may expose an upper surface of the active region 105, or may partially expose an upper portion. In some example embodiments, the device isolation layer 110 may have a curved upper surface to have a higher level toward the active region 105. The device isolation layer 110 may be formed of an insulating material.

The device isolation layer 110 may be, for example, oxide, nitride, or a combination thereof.

A channel structure 140 including lower channel layers 140A and upper channel layers 140B vertically spaced apart from each other on the active region 105, a gate structure 160 extending by intersecting the active region 105 and including a lower gate electrode 163A and an upper gate electrode 163B, source/drain regions 150 in contact with the channel structure 140, and a contact structure 180 connected to the source/drain regions 150 may be further included.

In the semiconductor device 100, the active region 105 may have a fin structure, and the lower gate electrode 163A and the upper gate electrode 163B may be disposed between the active region 105 and the channel structure 140, between the lower channel layers 140A and upper channel layers 140B of the channel structure 140, and on the channel structure 140. Accordingly, the semiconductor device 100 may include transistors having a multi bridge channel FET (MBCFET™) structure, which is a gate-all-around type field effect transistor. In some example embodiments, a semiconductor device may include transistors having a complementary FET (CFET) structure.

The gate structure 160 may include a lower gate structure 160A and an upper gate structure 160B.

The gate structure 160 may be disposed to intersect the active region 105 and channel structure 140 and to extend in a second direction, for example, in the Y-direction, on the active region 105 and the channel structure 140. Functional channel regions of the transistors may be formed in the active region 105 and/or the channel structure 140 intersecting the lower gate electrode 163A of the gate structure 160.

The lower gate structure 160A may include a lower gate electrode 163A, and a lower gate dielectric layer 162A disposed between the lower gate electrode 163A and the first to fourth lower channel layers 141A, 142A, 143A, and 144A. The lower gate structure 160A may extend in a second direction Y perpendicular to the first direction X, and may include portions disposed below each of the lower channel layers 140A. The lower gate structure 160A may surround a lower surface, an upper surface, and a side surface of each of the one or more lower channel layers 140A and the lowermost lower channel layer 141A in the second direction Y, and may cover the lower surface and side surface of the uppermost lower channel layer 144A.

The upper gate structure 160B may include an upper gate electrode 163B, an upper gate dielectric layer 162B between the upper gate electrode 163B and the first to fourth upper channel layers 141B, 142B, 143B, and 144B, gate spacers 164 on the side surfaces of the upper gate electrode 163B. The upper gate structure 160B may extend in the second direction Y, may include portions disposed on the upper channel layers 140B, respectively, and may vertically overlap the lower gate structure 160A. The upper gate structure 160B may surround a lower surface, an upper surface and a side surface of each of the one or more upper channel layers 140B and the uppermost upper channel layer 144B in the second direction Y, and may cover an upper surface and side surface of the lowermost upper channel layer 141B.

The lower gate dielectric layer 162A may be disposed between the active region 105 and the lower gate electrode 163A and between the lower channel layers 140A and the lower gate electrode 163A, and may be disposed to cover at least a portion of the surfaces of the lower gate electrode 163A. For example, the lower gate dielectric layer 162A may be disposed to surround the entirety of surfaces other than the uppermost surface of the lower gate electrode 163A.

The upper gate dielectric layer 162B may be disposed between the upper channel layers 140B and the upper gate electrode 163B, and may be disposed to cover at least a portion of the surfaces of the upper gate electrode 163B. For example, the upper gate dielectric layer 162B may be disposed to surround the entirety of surfaces other than the uppermost surface of the upper gate electrode 163B. The upper gate dielectric layer 162B may extend to a region between the upper gate electrode 163B and the gate spacers 164, but some example embodiments thereof are not limited thereto.

The lower gate dielectric layer 162A and the upper gate dielectric layer 162B may include an oxide, a nitride, or a high-κ material. The high-κ material may refer to a dielectric material having a dielectric constant higher than that of silicon oxide ($SiO_2$). The high-κ material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$). In some example embodiments, the lower gate dielectric layer 162A and the upper gate dielectric layer 162B may include a multilayer film.

The lower gate electrode 163A may fill a region between the first to fourth lower channel layers 141A, 142A, 143A, and 144A on the active region 105 may extend to the lower channel layers 140A. The lower gate electrode 163A may be spaced apart from the first to fourth lower channel layers 141A, 142A, 143A, and 144A by the lower gate dielectric layers 162A.

The upper gate electrode 163B may fill a region between the first to fourth upper channel layers 141B, 142B, 143B, and 144B on the barrier layer 170 and may extend to the upper channel layers 140B. The upper gate electrode 163B may be spaced apart from the first to fourth upper channel layers 141B, 142B, 143B, and 144B by the upper gate dielectric layer 162B.

The lower gate electrode 163A and the upper gate electrode 163B may include a conductive material, for example, a metal nitride such as titanium nitride (TiN), tantalum nitride (TaN), or tungsten nitride (WN), and/or a metal material such as aluminum (Al), tungsten (W), or molybdenum (Mo) or semiconductor materials such as doped polysilicon. In some example embodiments, the lower gate electrode 163A and the upper gate electrode 163B may include two or more multilayers. In some example embodiments, the lower gate electrode 163A and the upper gate electrode 163B may be formed of a material having an appropriate work function in consideration of a desired threshold voltage. The lower gate electrode 163A may include an N-type work function layer, and the upper gate electrode 163B may include a P-type work function layer, but some example embodiments thereof are not limited thereto. In some example embodiments, the lower gate electrode 163A may include a P-type work function layer, and the upper gate electrode 163B may include an N-type work function layer.

The gate spacers 164 may be disposed on both side surfaces of the upper gate electrode 163B on the upper channel layers 140B. The gate spacers 164 may insulate the upper source/drain regions 150 from the upper gate electrode 163B. The gate spacers 164 may have a multilayer structure in some example embodiments. The gate spacers 164 may be formed of oxide, nitride, and oxynitride, and may be formed of a low-κ film, for example.

The channel structure 140 may include lower channel layers 140A and upper channel layers 140B. In some example embodiments, "lower active layers" and "upper active layers" in some example embodiments may be referred to as "lower channel layers" and "upper channel layers," respectively.

The lower channel layers 140A may include first to fourth lower channel layers 141A, 142A, 143A, and 144A, which are two or more channel layers disposed in order and spaced apart from each other in a direction perpendicular to the upper surface of the substrate 101, for example, in the Z-direction, on the active region 105. The first to fourth lower channel layers 141A, 142A, 143A, and 144A may be disposed between the lower source/drain regions 150A, may be connected to the lower source/drain regions 150A, and may be spaced apart from the upper surface of the active region 105. The lower channel layers 140A may include a lowermost lower channel layer 141A, an uppermost lower channel layer 144A, and one or more lower channel layers 140A disposed between the lowermost lower channel layer 141A and the uppermost lower channel layer 144A.

The upper channel layers 140B may include two or more plurality of channel layers, first to fourth upper channel layers 141B, 142B, 143B, and 144B disposed in order and spaced apart from each other in a direction perpendicular to the upper surface of the barrier layer 170, for example, in the Z-direction, on the barrier layer 170. The upper channel layers 140B may include the lowermost upper channel layer 141B, an uppermost upper channel layer 144B, and one or more upper channel layers 140B disposed between the lowermost upper channel layer 141B and the uppermost upper channel layer 144B. The first to fourth upper channel layers 141B, 142B, 143B, and 144B may be connected to the upper source/drain regions 150B. The upper channel layers 140B may vertically overlap the lower channel layers 140A.

The first to fourth lower channel layers 141A, 142A, 143A, and 144A and the first to fourth upper channel layers 141B, 142B, 143B, and 144B may have the same width or similar widths as that of the active region 105 in the Y-direction and may have the same width or similar width as that of the gate structure 160 in the X-direction. However, in some example embodiments, the first to fourth lower channel layers 141A, 142A, 143A, and 144A and the first to fourth upper channel layers 141B, 142B, 143B, and 144B may have a reduced width such that the side surfaces may be disposed below the gate structure 160 in the X-direction.

The first to fourth lower channel layers 141A, 142A, 143A, and 144A and the first to fourth upper channel layers 141B, 142B, 143B, and 144B may be formed of a semiconductor material, for example, silicon (Si), silicon germanium (SiGe), and germanium (Ge). The first to fourth lower channel layers 141A, 142A, 143A, and 144A and the first to fourth upper channel layers 141B, 142B, 143B, and 144B may be formed of the same material as that of the substrate 101, for example. The number of the first to fourth lower channel layers 141A, 142A, 143A, and 144A and the first to fourth upper channel layers 141B, 142B, 143B, and 144B and shapes thereof may be varied in some example embodiments.

The source/drain regions 150 may include lower source/drain regions 150A and upper source/drain regions 150B disposed on the lower source/drain regions 150A.

The source/drain regions 150 may be provided as a source region or a drain region of a transistor. The source/drain regions 150 may be disposed in recess regions partially recessed into an upper portion of the active region 105 on both sides of the gate structure 160. The source/drain regions 150 may be disposed to cover side surfaces of the lower channel layers 140A and the upper channel layers 140B, respectively. In some example embodiments, the lowermost end of the lower source/drain regions 150A may be disposed on a level lower than a level of the lowermost surface of the lower gate structure 160A.

The source/drain regions 150 may include a plurality of epitaxial layers, but some example embodiments thereof are not limited thereto. The source/drain regions 150 may be configured as a semiconductor layer including silicon (Si) and/or germanium (SiGe). The source/drain regions 150 may include impurities of different types and/or concentrations. The lower source/drain regions 150A and upper source/drain regions 150B may have different conductivity-types. In some example embodiments, the lower source/drain regions 150A may include N-type doped silicon (Si) and/or the upper source/drain regions 150B may include P-type doped silicon germanium (SiGe). However, some example embodiments thereof are not limited thereto, and in some example embodiments, the lower source/drain regions 150A may include P-type doped silicon germanium (SiGe) and/or the upper source/drain regions 150B may include N-type doped silicon (Si). In some example embodiments, the source/drain regions 150 may include a plurality of regions including different concentrations of elements and/ or doping elements.

The lower source/drain regions 150A may include a first lower epitaxial layer 150A_1, a second lower epitaxial layer 150A_2, and a third lower epitaxial layer 150A_3. The first lower epitaxial layer 150A_1, the second lower epitaxial layer 150A_2, and the third lower epitaxial layer 150A_3 may include silicon (Si) and may include impurities of different elements and/or concentrations.

Each of the lower source/drain regions 150A may be spaced apart from each other in the first direction X. The lower source/drain regions 150A may be spaced apart from each other on the first level. The lower source/drain regions 150A may include a first lower epitaxial layer 150A_1 disposed on the active region 105 and containing impurities of the first concentration, a second lower epitaxial layer 150A_2 disposed on the first lower epitaxial layer 150A_1, extending to be in contact with the lower channel layers 140A, and including impurities of a second concentration lower than the first concentration, and a third lower epitaxial layer 150A_3 in contact with the first lower epitaxial layer 150A_1, disposed on the internal surface of the second lower epitaxial layer 150A_2, and including impurities of a third concentration higher than the second concentration. In some example embodiments, the third lower epitaxial layer 150A_3 may be spaced apart from the lower channel layers 140A by the second lower epitaxial layer 150A_2.

The lower source/drain regions 150A may have an N-type conductivity-type and may be an epitaxially grown layer. For example, the first lower epitaxial layer 150A_1, the second lower epitaxial layer 150A_2, and the third lower epitaxial layer 150A_3 may include one of phosphorus (P) and arsenic (As) as a doping element.

Each of the upper source/drain regions 150B may be spaced apart from each other in the first direction X and may vertically overlap the lower source/drain regions 150A. Each of the upper source/drain regions 150B may be spaced apart from each other on a second level, higher than the first level. The upper source/drain regions 150B may include a first upper epitaxial layer 150B_1 and a second upper epitaxial layer 150B_2. The first upper epitaxial layer

150B_1 may be disposed on the barrier layer 170 and may extend to be in contact with the first to fourth upper channel layers 141B, 142B, 143B, and 144B. The first upper epitaxial layer 150B_1 may be in contact with the upper gate structure 160B disposed below each of the first to fourth upper channel layers 141B, 142B, 143B, and 144B. The shape of the first upper epitaxial layer 150B_1 may be changed depending on the shape of the first to fourth upper channel layers 141B, 142B, 143B, and 144B, and the shape of the upper gate structure 160B. The second upper epitaxial layer 150B_2 may be disposed on the first upper epitaxial layer 150B_1. The second upper epitaxial layer 150B_2 may be spaced apart from the barrier layer 170 and the upper channel layers 140B by the first upper epitaxial layer 150B_1. The number of the epitaxial layers and the shape thereof may be varied in some example embodiments.

The first upper epitaxial layer 150B_1 and the second upper epitaxial layer 150B_2 may include silicon germanium (SiGe) doped with a group 3 element and may have a P-type conductivity-type. For example, the first upper epitaxial layer 150B_1 and the second upper epitaxial layer 150B_2 may be doping elements, and may include one of boron (B), aluminum (Al), gallium (Ga), indium (In) and thallium (Tl). A concentration of germanium (Ge) of the first upper epitaxial layer 150B_1 may be lower than those of the lower sacrificial layers (120A in FIG. 9A), the intermediate sacrificial layer (120B in FIG. 9A), and the sacrificial barrier layer (120D in FIG. 13) before the gate structure 160 is replaced.

The first upper epitaxial layer 150B_1 may have a lower etch selectivity than those of the lower sacrificial layers (120A in FIG. 9A), the intermediate sacrificial layer (120B in FIG. 9A), and the sacrificial barrier layer (120D in FIG. 13) under specific etching conditions during the manufacturing process. Due to the difference in etch selectivity, the lower sacrificial layers (120A in FIG. 9A), the intermediate sacrificial layer (120B in FIG. 9A), and the sacrificial barrier layer (120D in FIG. 13) may be selectively removed, and a second upper epitaxial layer 150B_2 surrounded by the first upper epitaxial layer 150B_1 may remain. In some example embodiments, the first upper epitaxial layer 150B_1 and the second upper epitaxial layer 150B_2 may have different germanium (Ge) concentrations. For example, the first upper epitaxial layer 150B_1 may include a first concentration of germanium (Ge). The second upper epitaxial layer 150B_2 may include germanium (Ge) of a second concentration higher than the first concentration. The germanium concentration may increase in the order of the first upper epitaxial layer 150B_1 and the second upper epitaxial layer 150B_2.

The barrier layer 170 may be in contact with at least one of the lower channel layers 140A and at least one of the upper channel layers 140B. In some example embodiments, the barrier layer 170 may be in contact with the upper surface of the uppermost channel layer 144A of the lower channel layers 140A and the lower surface of the lowermost channel layer 141A of the upper channel layers 140B. For example, the barrier layer 170 may be in contact with the upper surface of the fourth lower channel layer 144A and the lower surface of the first upper channel layer 141B. The barrier layer 170 may be disposed between the upper source/drain regions 150B and the lower source/drain regions 150A. The barrier layer 170 may be spaced apart from the lower gate structure 160A by the lower channel layers 140A and may be spaced apart from the upper gate structure 160B by the upper channel layers 140B. At least a portion of the surface in contact with the barrier layer 170 and the lower source/drain regions 150A or at least a portion of the surface in contact with the barrier layer 170 and the upper source/drain regions 150B may have a curved shape, but some example embodiments thereof are not limited thereto. In some example embodiments, the upper surface of the second region 170B of the barrier layer 170 may have a curved shape curved upwardly, and the lower surface of the second region 170B of the barrier layer 170 may have a curved shape curved downwardly.

In some example embodiments, the "first portion" and "second portion" in some example embodiments may be referred to as "first region" and "second region," respectively.

The barrier layer 170 may include a first region 170A disposed between the uppermost lower channel layer 144A of the lower channel layers 140A and the lowermost upper channel layer 141B of the upper channel layers 140B, and a second region 170B extending from the first region 170A to a region between the lower source/drain regions 150A and the upper source/drain regions 150B. The barrier layer 170 may be disposed to extend to a region between the lower source/drain regions 150A and the upper source/drain regions 150B. In some example embodiments, at least a portion of the barrier layer 170 may extend from the first region 170A to the second region 170B. The barrier layer 170 may further include a portion extending from a portion in contact with the uppermost lower channel layer 144A and the lowermost upper channel layer 141B to a region between the upper source/drain regions 150B and the lower source/drain regions 150A. The thickness of the barrier layer 170 disposed in the second region 170B may be greater than the thickness of the barrier layer 170 disposed in the first region 170A, but some example embodiments thereof are not limited thereto.

The contact structure 180 may include a lower contact structure 180A electrically connected to the lower source/drain regions 150A and an upper contact structure 180B electrically connected to the upper source/drain regions 150B.

The contact structure 180 may be disposed on the source/drain regions 150, and may be disposed to have a longer length in the Y-direction than that of the source/drain regions 150 in some example embodiments. The contact structure 180 may be disposed to be recessed into the source/drain regions 150 to a predetermined (or, alternatively, desired or selected) depth.

The lower contact structure 180A may penetrate through at least a portion of the substrate 101 and the active region 105 and may be in contact with the lower source/drain regions 150A, and may apply an electrical signal to the lower source/drain regions 150A.

The upper contact structure 180B may penetrate through at least a portion of the first and second interlayer insulating layers 191 and 192 and may be in contact with the upper source/drain regions 150B, and may apply an electrical signal to the upper source/drain regions 150B.

The contact structure 180 may include a metal silicide layer (not shown) disposed on the lower end including the lower surface, and may further include a barrier layer forming the side surfaces of the contact structure 180 and extending to the upper surface of the metal silicide layer. The barrier layer may include, for example, a metal nitride such as titanium nitride (TiN), tantalum nitride (TaN), or tungsten nitride (WN). The contact structure 180 may include, for example, a metal material such as aluminum (Al), tungsten (W), or molybdenum (Mo). In some example embodiments, the number of the conductive layers included in the contact structure 180 and the arrangement thereof may be varied.

The gate contact structure 190 may include a lower gate contact structure 190A and an upper gate contact structure 190B. The lower gate contact structure 190A may be in contact with the lower gate electrode 163A, and the upper gate contact structure 190B may be in contact with the upper gate electrode 163B. The gate contact structure 190 may have a shape and material similar to those of the contact structure 180, but some example embodiments thereof are not limited thereto. In some example embodiments, each of the lower and upper gate contact structures 190A and 190B may include a lower gate contact barrier layer 190A_1 and an upper gate contact barrier layer 190B_1.

The first to fifth interlayer insulating layers 191, 192, 193, 194, and 195 may include, for example, at least one of an oxide, a nitride, an oxynitride, and a low-κ dielectric. The first to third interlayer insulating layers 191, 192, and 193 may be disposed to cover the upper source/drain regions 150B and the upper gate structure 160B. The fourth and fifth interlayer insulating layers 194 and 195 may be disposed to cover the substrate 101 and the active region 105.

In some example embodiments, first wiring M1 may include a first upper metal wiring M1*a* and a second upper metal wiring M1*b*, and the second wiring M2 may include a first lower metal wiring M2*a* and a second lower metal wiring M2*b*. The first upper metal wiring M1*a* may be electrically connected to the upper source/drain regions 150B through the upper contact structure 180B, and the second upper metal wiring M1*b* may be electrically connected to the upper gate electrode 163B through the upper gate contact structure 190B. The first lower metal wiring M2*a* may be electrically connected to the lower source/drain regions 150A through the lower contact structure 180A, and the second lower metal wiring M2*b* may be electrically connected to the lower gate electrode 163A through the lower gate contact structure 190A.

In the description of example embodiments below, descriptions overlapping those described above with reference to FIGS. 1 to 2B will not be provided.

Figure 3A:
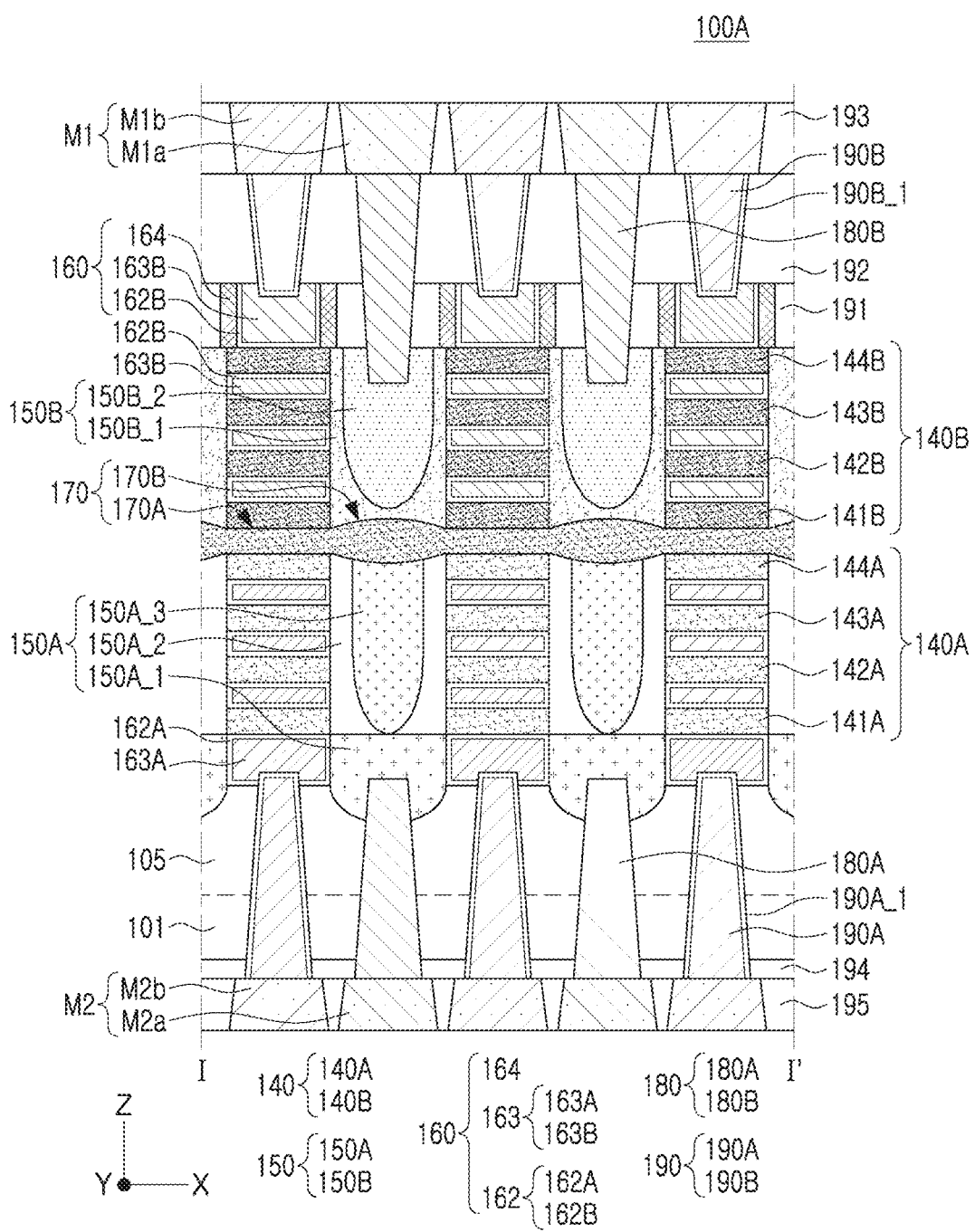
FIGS. 3A and 3B are cross-sectional diagrams illustrating a semiconductor device according to some example embodiments of the present disclosure.
Figure 3B:
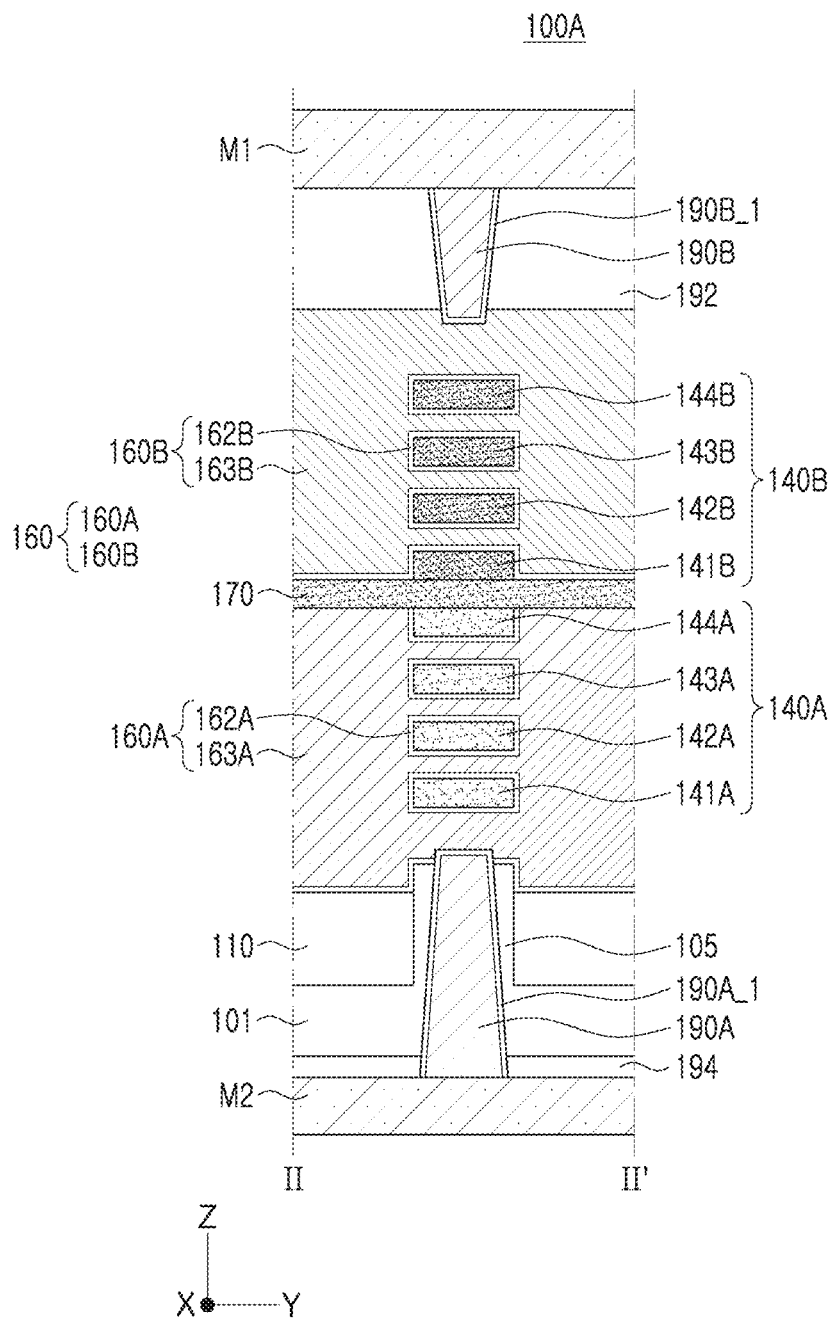

FIGS. 3A and 3B are cross-sectional diagrams illustrating a semiconductor device 100A in some example embodiments, illustrating regions corresponding to FIGS. 2A and 2B, respectively.

Figure 9A:
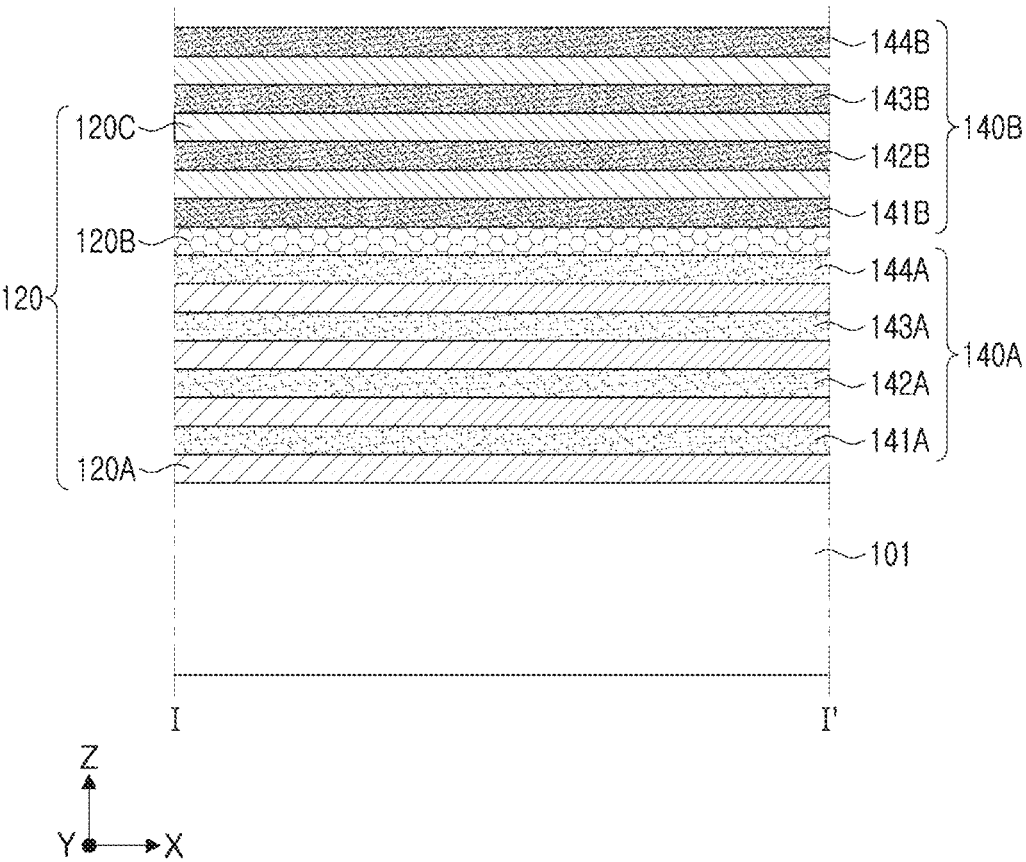
FIGS. 9A, 9B, 10A, 10B, 11, 12, 13, 14, 15A, 15B, 16A, 16B, 17A, 17B, 18A, 18B, 19A, 19B, 20A, 20B, 21A and 21B are cross-sectional diagrams illustrating processes of a method of manufacturing a semiconductor device in order according to some example embodiments of the present disclosure.
Figure 9B:
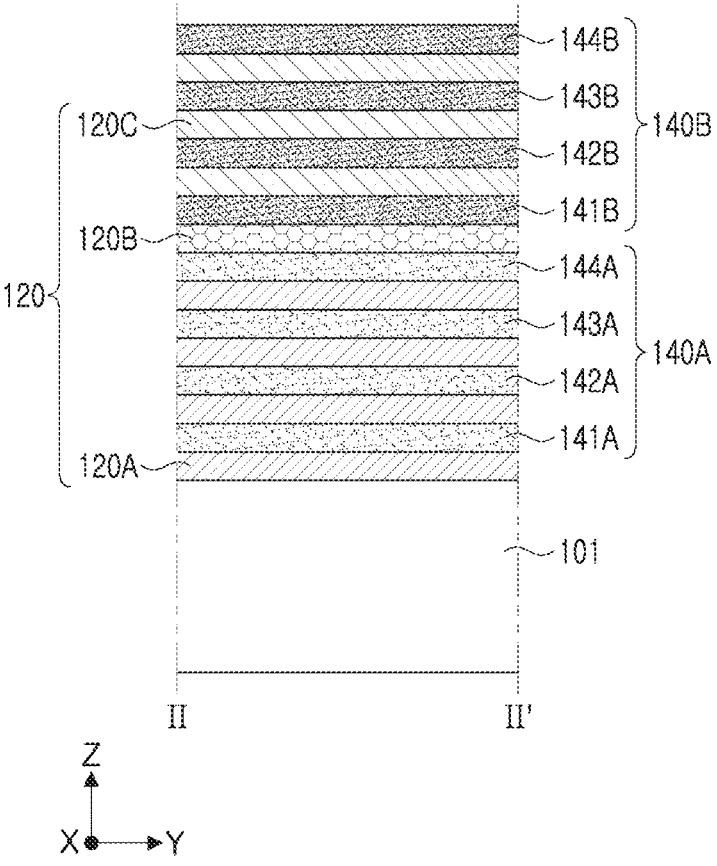

Referring to FIGS. 3A and 3B, a thickness of the lowermost gate electrode 163A of the lower gate structure 160A of the semiconductor device 100A may be different from the other example embodiments. For example, the thickness of the lowermost gate electrode 163A of the lower gate structure 160A of the semiconductor device 100A may be larger than (e.g., two times or more) a thickness of the lowermost gate electrode 163A of the lower gate structure 160A of the semiconductor devices 100, 100B, etc. from the other example embodiments In some example embodiments, the thickness of the lowermost gate structure 160A disposed below the first lower channel layer 141A may be greater than the thickness of the lower gate structure 160A disposed below the second to fourth lower channel layers 142A, 143A, and 144A. As illustrated in FIGS. 9A and 9B, by increasing the thickness of the lowermost sacrificial layer 120A, the semiconductor device 100A may be provided. Accordingly, in a subsequent process of forming the lower gate contact structure 190A, a contact margin between the lower gate contact structure 190A and the lower gate electrode 163A may be secured.

In some example embodiments, similar to the thickness of the lowermost gate electrode 163A of the lower gate structure 160A of the semiconductor device 100A, a thickness of first lower epitaxial layer 150A_1 of the semiconductor device 100A may be different (for example, larger) from the other example embodiments.

Figure 4:
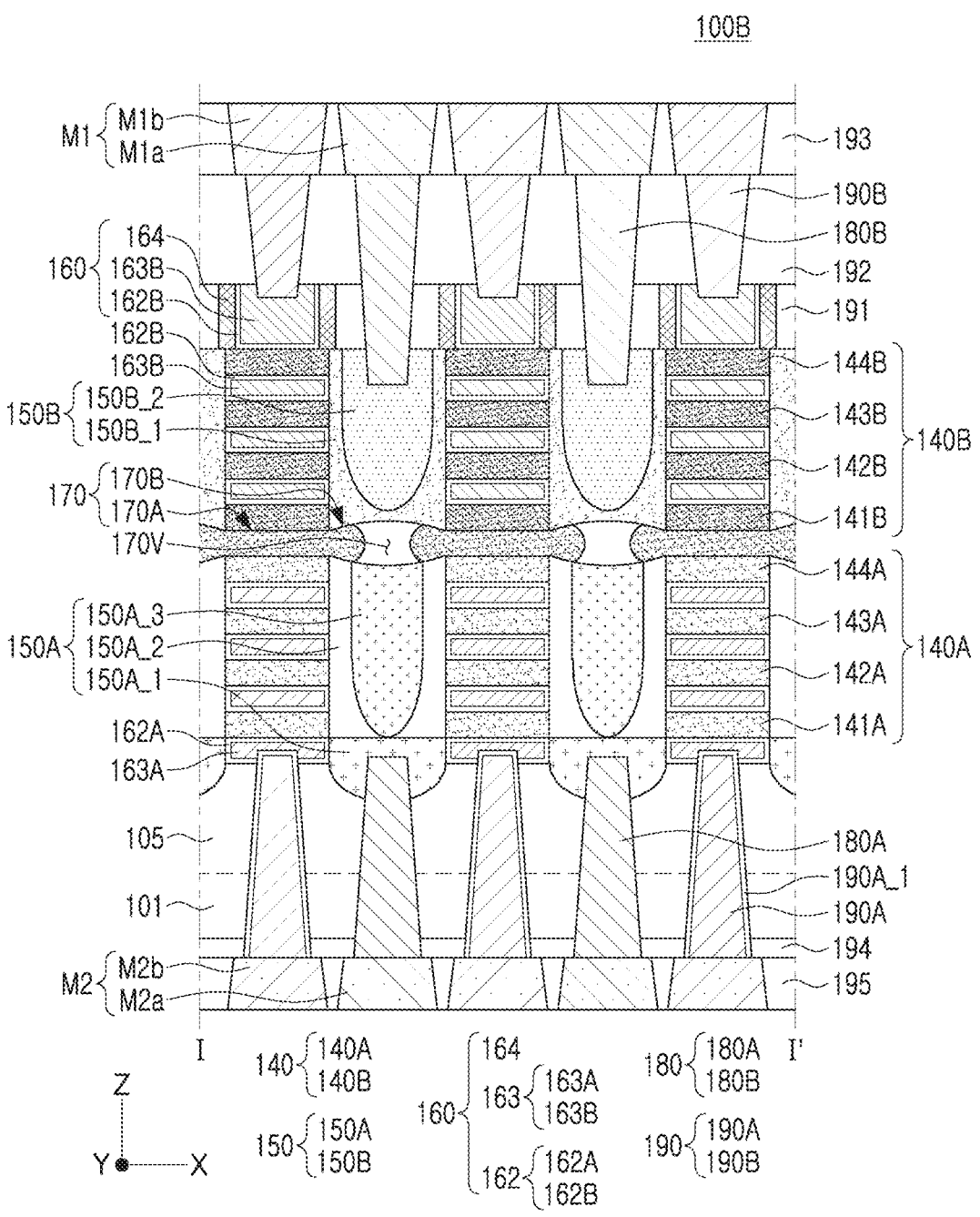
FIGS. 4, 5, 6, 7, 8A and 8B are cross-sectional diagrams illustrating a semiconductor device according to some example embodiments of the present disclosure.

FIG. 4 is a cross-sectional diagram illustrating a semiconductor device 100B according to some example embodiments, illustrating a region corresponding to FIG. 2A.

Referring to FIG. 4, an air gap 170V disposed between the lower source/drain regions 150A and the upper source/drain regions 150B and disposed on the side surface of the barrier layer 170 on the second region 170B may be further included. The air gap 170V, for example, may include air or a gas formed of a material used in a process of manufacturing the semiconductor device 100B.

Figure 5:
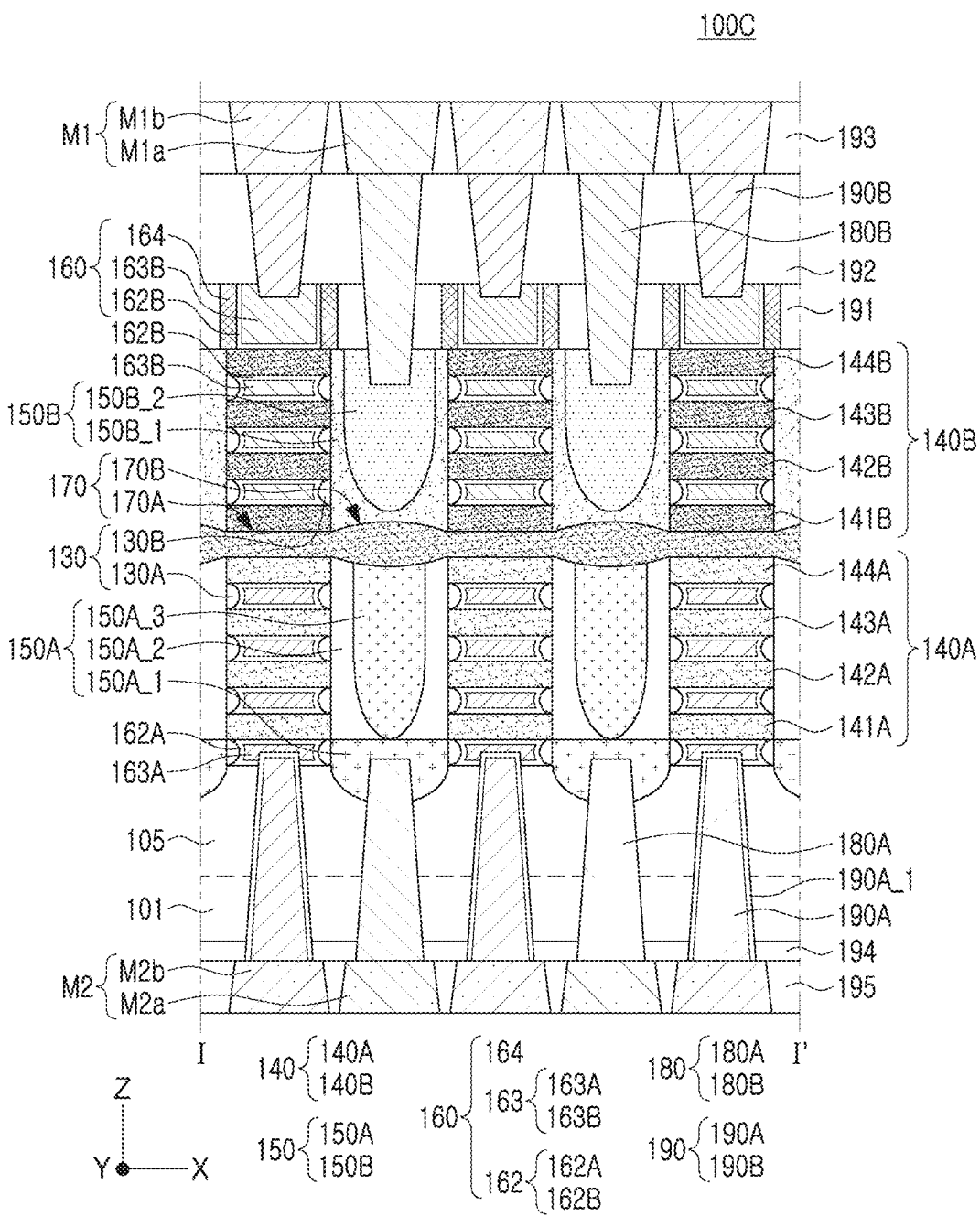

FIG. 5 is a cross-sectional diagram illustrating a semiconductor device 100C according to some example embodiments, illustrating a region corresponding to FIG. 2A.

Referring to FIG. 5, the semiconductor device 100C may further include internal spacers 130 disposed between the lower gate structure 160A and the lower source/drain regions 150A and/or between the upper gate structure 160B and the upper source/drain regions 150B in the first direction X.

The internal spacers 130 may include lower internal spacers 130A and upper internal spacers 130B. The lower internal spacers 130A may be disposed parallel to the lower gate electrode 163A between the first to fourth lower channel layers 141A, 142A, 143A, and 144A in the Z-direction. For example, the lower internal spacers 130A may separate or completely separate the first to fourth lower channel layers 141A, 142A, 143A, and 144A in the Z-direction. The upper internal spacers 130B may be disposed parallel to the upper gate electrode 163B between the first to fourth upper channel layers 141B, 142B, 143B, and 144B in the Z-direction. The lower gate electrode 163A and the upper gate electrode 163B may be stably spaced apart from the source/drain regions 150 by the lower internal spacers 130A and the upper internal spacers 130B, respectively, and may be electrically isolated from each other. A side surface of the internal spacers 130 opposing the lower gate electrode 163A and the upper gate electrode 163B may have a rounded shape, rounded toward the internal side toward the lower gate electrode 163A and the upper gate electrode 163B, but some example embodiments thereof are not limited thereto. The internal spacers 130 may be formed of oxides, nitrides and/or oxynitrides, and may be, for example, formed of low-κ films. However, in some example embodiments, the internal spacers 130 may not be provided, or only the lower internal spacers 130A may be provided, or only the upper internal spacers 130B may be provided.

Figure 6:
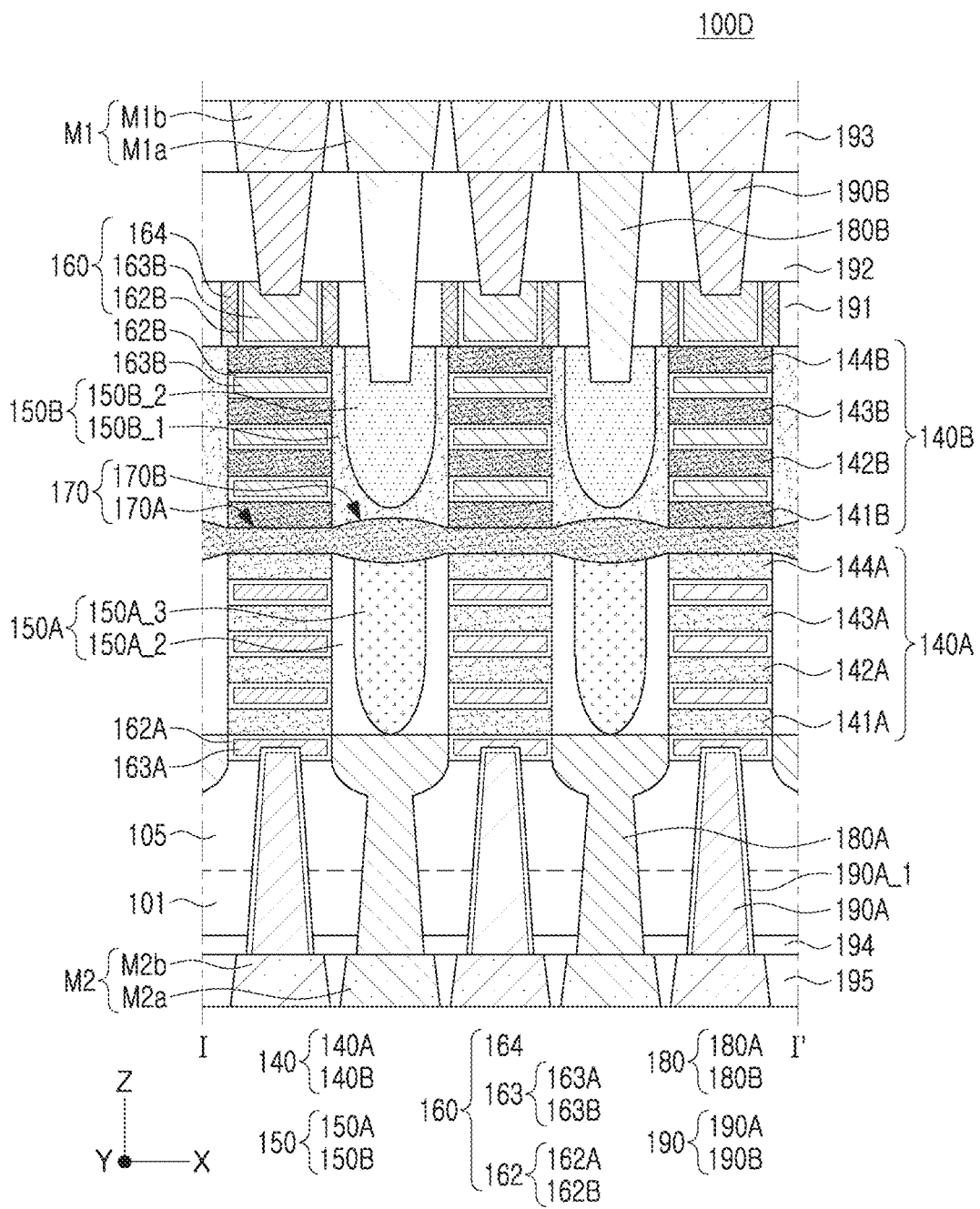

FIG. 6 is a cross-sectional diagram illustrating a semiconductor device 100D according to some example embodiments, illustrating a region corresponding to FIG. 2A.

Referring to FIG. 6, a lower contact structure 180A may be formed in a region corresponding to the first lower epitaxial layer 150A_1 in FIG. 2A. In the process of forming the lower source/drain regions 150A, the first lower epitaxial layer 150A_1 may be formed of a material including silicon germanium. Thereafter, in the process of forming the lower contact structure 180A, the lower contact structure 180A in a region corresponding to the first lower epitaxial layer 150A_1 in FIG. 2A may be formed by selectively removing the first lower epitaxial layer 150A_1.

Figure 7:
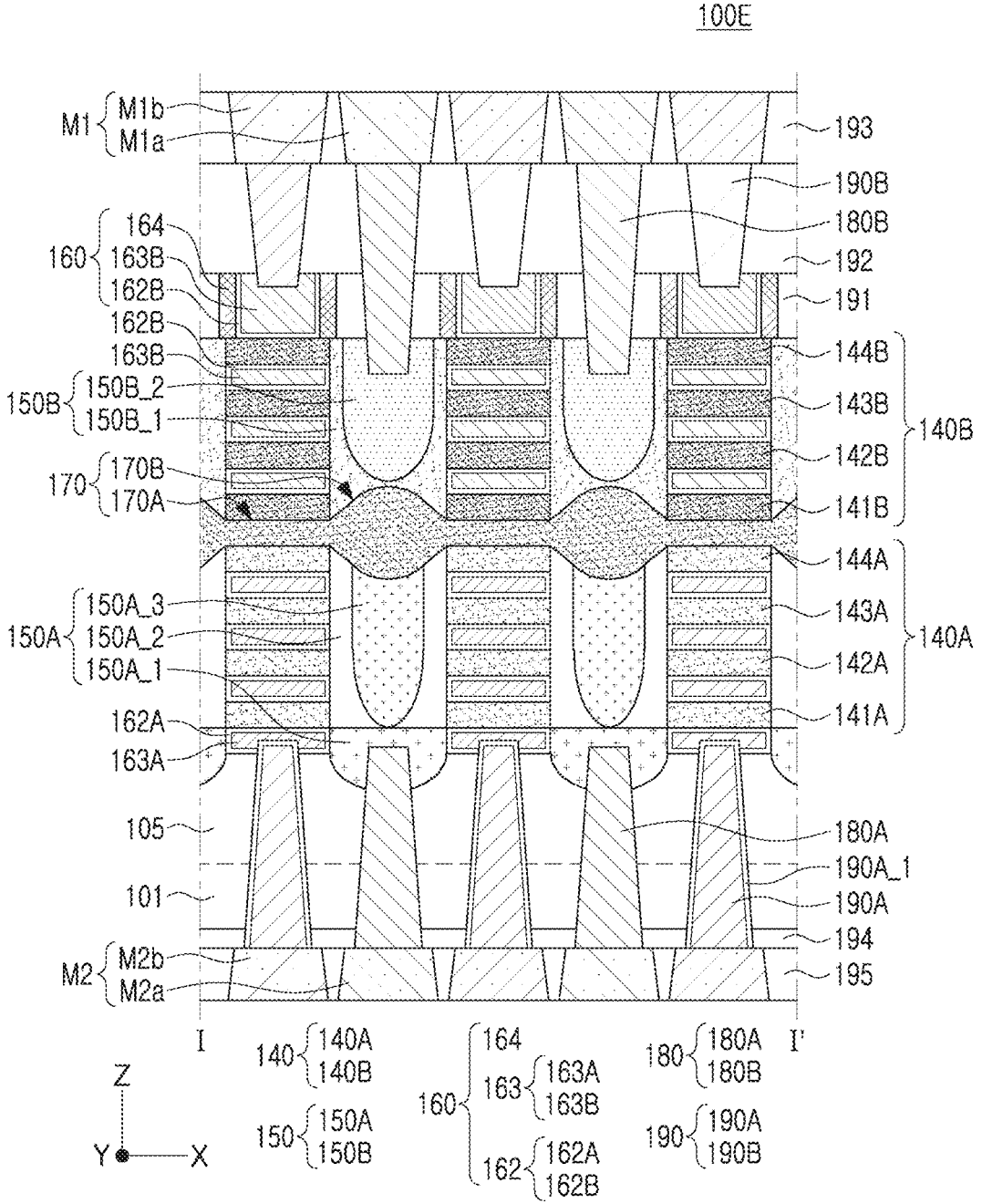

FIG. 7 is a cross-sectional diagram illustrating a semiconductor device 100E according to some example embodiments, illustrating a region corresponding to FIG. 2A.

Referring to FIG. 7, at least a portion of the surface in contact with the barrier layer 170 and the upper source/drain regions 150B or the surface in contact with the lower source/drain regions 150A may have a (111) crystal orientation. This may be because at least a portion of the lower surface or upper surface of the sacrificial barrier layer 120D has a (111) crystal orientation in a subsequent process of forming the sacrificial barrier layer 120D. The barrier layer 170 may be spaced apart from the second upper epitaxial layer 150B_2.

Figure 8A:
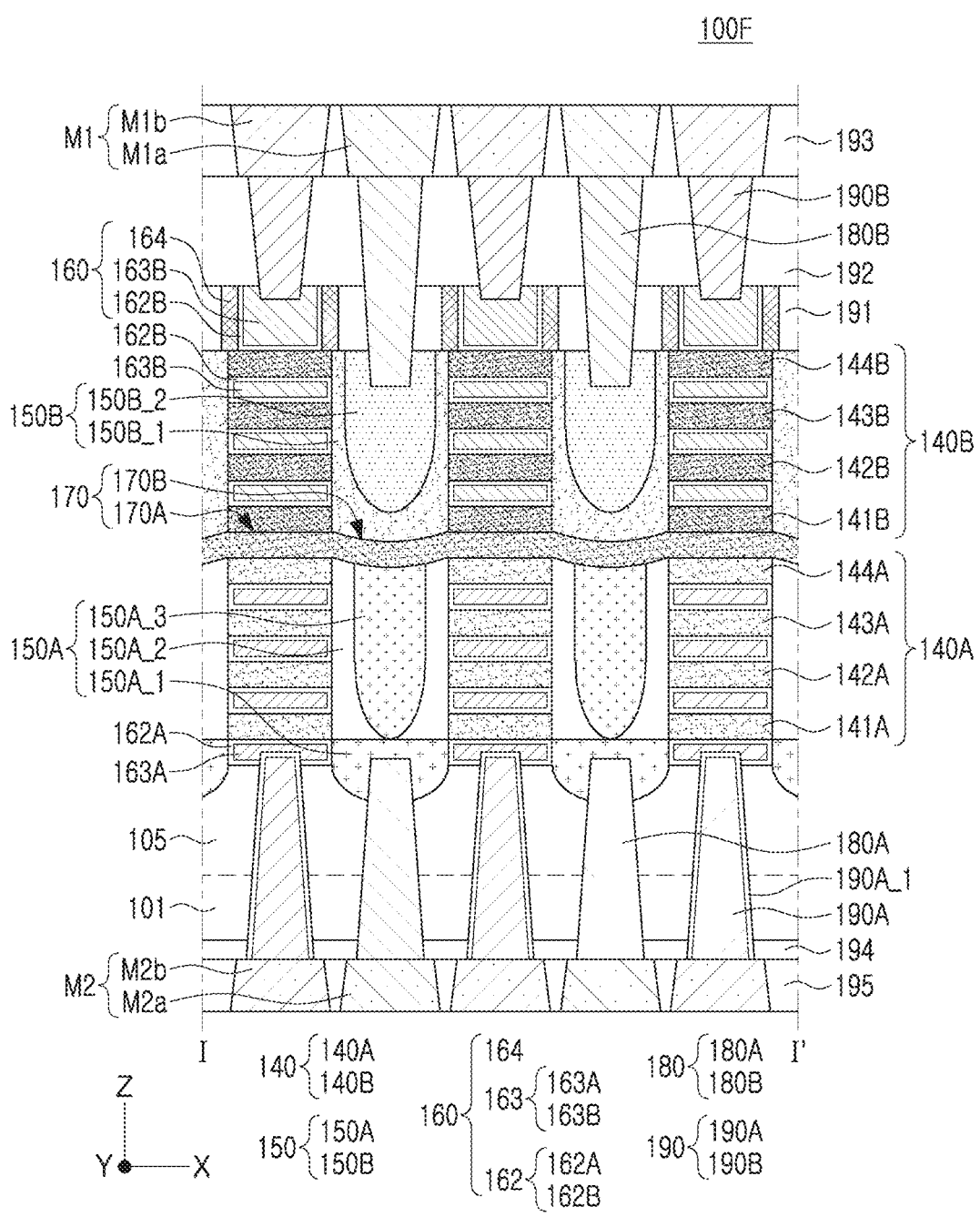

FIG. 8A is a cross-sectional diagram illustrating a semiconductor device 100F according to some example embodiments, illustrating a region corresponding to FIG. 2A.

Referring to FIG. 8A, a surface on which the barrier layer and the upper source/drain regions are in contact with each other may have a downwardly curved shape. The surface in contact with the barrier layer and the lower source/drain regions may have a downwardly curved shape, but some example embodiments thereof are not limited thereto and the surface may have an upwardly curved shape.

Figure 8B:
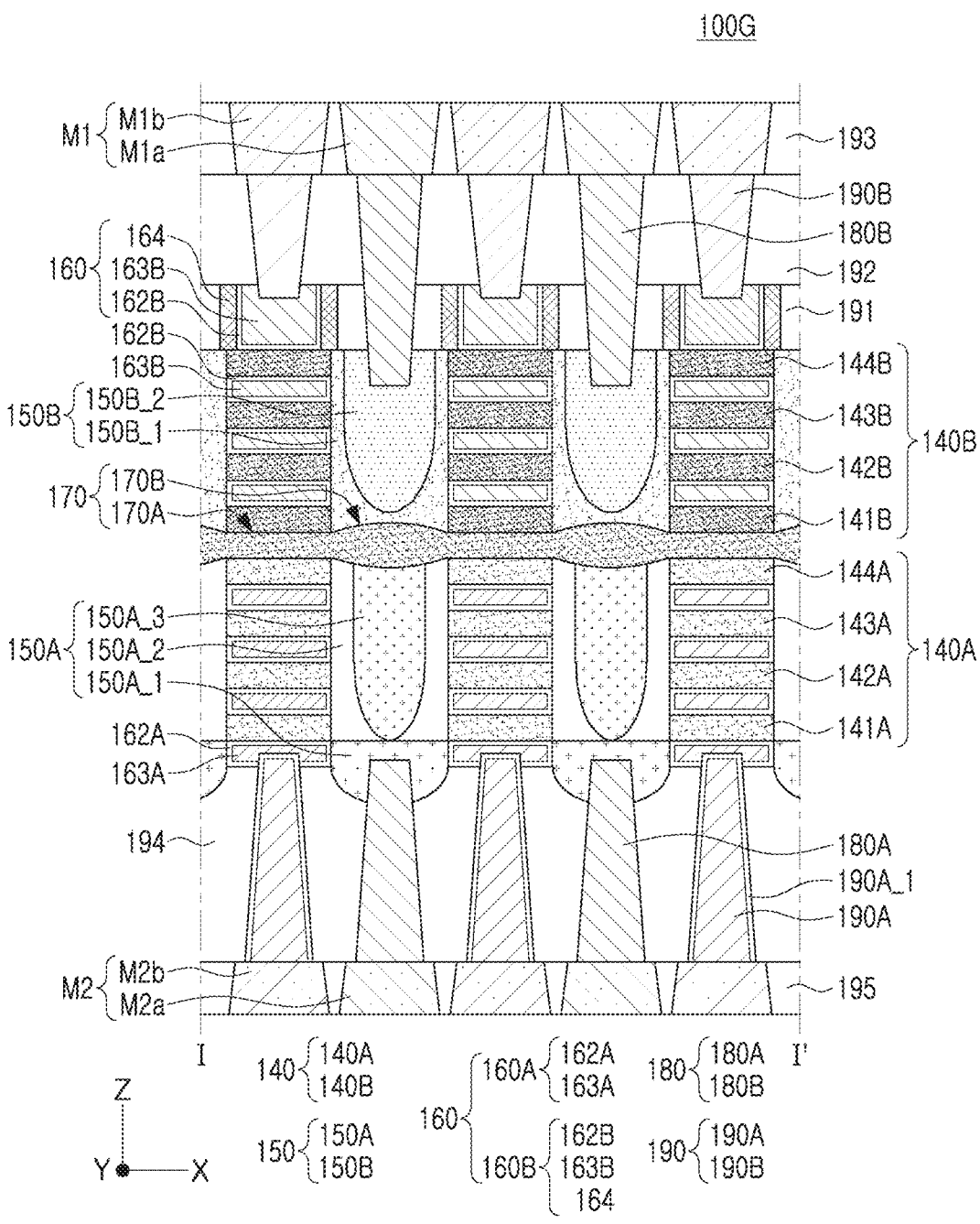

FIG. 8B is a cross-sectional diagram illustrating a semiconductor device 100G according to some example embodiments, illustrating a region corresponding to FIG. 2A.

Referring to FIG. 8B, differently from the semiconductor device 100 in FIG. 2A, in a process of forming a lower contact structure 180A and a lower gate contact structure 190A, both the substrate 101 and the active region 105 may be removed, thereby providing the semiconductor device 100G. Accordingly, the substrate 101 and the active region 105 may be removed, the fourth interlayer insulating layer 194 may be formed, and thereafter, the lower contact structure 180A and the lower gate contact structure 190A may be formed.

FIGS. 9A, 9B, 10A, 10B, 11, 12, 13, 14, 15A, 15B, 16A, 16B, 17A, 17B, 18A, 18B, 19A, 19B, 20A, 20B, 21A and 21B are cross-sectional diagrams illustrating processes of a method of manufacturing a semiconductor device in order according to some example embodiments. FIGS. 9A, 10A, 11, 12, 13, 14, 15A, 16A, 17A, 18A, 19A, 20A, and 21A illustrate cross-sections corresponding to FIG. 2A, and FIGS. 9B, 10B, 15B, 16B, 17B, 18B, 19B, 20B, and 21B illustrate cross-sections corresponding to FIG. 2B.

Referring to FIGS. 9A and 9B, sacrificial layers 120, first to fourth lower channel layers 141A, 142A, 143A, and 144A, and first to fourth upper channel layers 141B, 142B, 143B, and 144B may be alternately stacked.

The sacrificial layers 120 may include lower sacrificial layers 120A, intermediate sacrificial layers 120B, and upper sacrificial layers 120C. The lower sacrificial layers 120A may be replaced with a lower gate dielectric layer 162A and a lower gate electrode 163A as illustrated in FIG. 2A through a subsequent process. The intermediate sacrificial layers 120B may be replaced with a barrier layer 170 as illustrated in FIG. 2A through a subsequent process. The upper sacrificial layers 120C may be replaced with an upper gate dielectric layer 162B and an upper gate electrode 163B as illustrated in FIG. 2A through a subsequent process.

The sacrificial layers 120 may be formed of a material having etching selectivity with respect to first to fourth lower channel layers 141A, 142A, 143A, and 144A and first to fourth upper channel layers 141B, 142B, 143B, and 144B. The first to fourth lower channel layers 141A, 142A, 143A, and 144A and the first to fourth upper channel layers 141B, 142B, 143B, and 144B may include materials different from those of the sacrificial layers 120. In some example embodiments, the first to fourth lower channel layers 141A, 142A, 143A, and 144A and the first to fourth upper channel layers 141B, 142B, 143B, and 144B may include silicon (Si), and the sacrificial layers 120 may include silicon germanium (SiGe).

The lower sacrificial layers 120A, the intermediate sacrificial layers 120B, and the upper sacrificial layers 120C may be formed of materials having etching selectivity with respect to each other. The lower sacrificial layers 120A, the intermediate sacrificial layers 120B, and the upper sacrificial layers 120C may include different concentrations of germanium. In some example embodiments, the lower sacrificial layers 120A may include germanium of a first concentration, the intermediate sacrificial layers 120B may include germanium of a second concentration lower than the first concentration, and the upper sacrificial layers 120C may include germanium of a third concentration lower than the second concentration. In some example embodiments, the concentration of germanium of each of the lower sacrificial layers 120A may be exactly or about 45 at % to exactly or about 60a %, the concentration of germanium of the intermediate sacrificial layer 120B may be exactly or about 30 at % to exactly or about 45 at %, and the concentration of germanium of each of the upper sacrificial layers 120C may be exactly or about 5 at % to exactly or about 30 at %. Specifically, the concentration of germanium of each of the lower sacrificial layers 120A may be exactly or about 50 at %, the concentration of germanium of the intermediate sacrificial layer 120B may be exactly or about 35 at %, and the concentration of germanium of each of the upper sacrificial layers 120C may be exactly or about 15 at %.

The sacrificial layers 120, the first to fourth lower channel layers 141A, 142A, 143A, and 144A and the first to fourth upper channel layers 141B, 142B, 143B, and 144B may be formed by performing an epitaxial growth process using the substrate 101 as a seed. Each of the sacrificial layers 120, the first to fourth lower channel layers 141A, 142A, 143A, and 144A, and the first to fourth upper channel layers 141B, 142B, 143B, and 144B may have a thickness ranging from exactly or about 1 Å to exactly or about 100 nm. The number of the first to fourth lower channel layers 141A, 142A, 143A, and 144A and the first to fourth upper channel layers 141B, 142B, 143B, and 144B alternately stacked with the sacrificial layers 120 may be varied in some example embodiments.

Figure 10A:
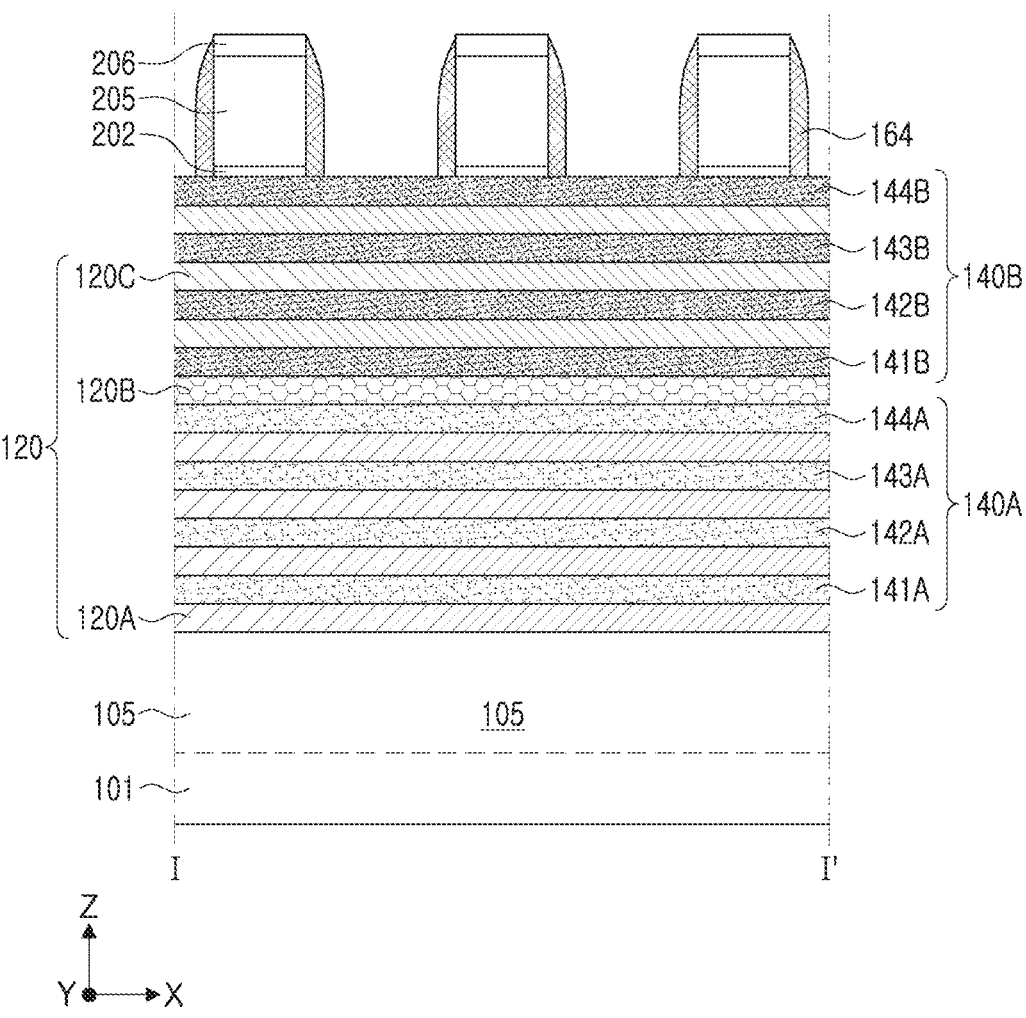
Figure 10B:
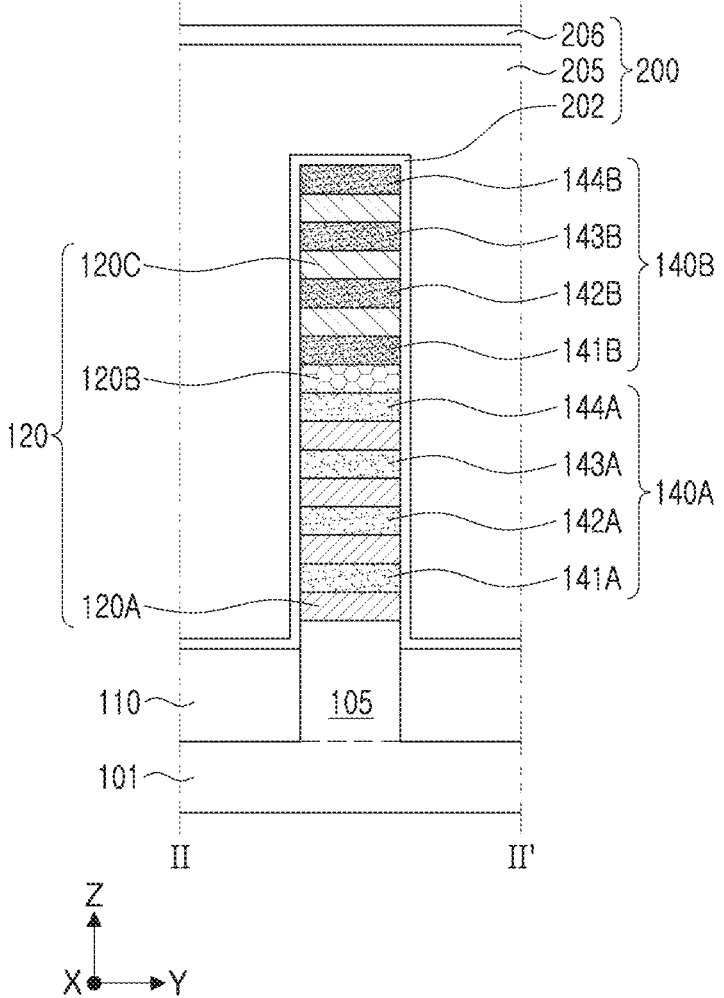

Referring to FIGS. 10A and 10B, active structures may be formed by removing a portion of the sacrificial layers 120, the first to fourth lower channel layers 141A, 142A, 143A, and 144A, the first to fourth upper channel layers 141B, 142B, 143B, and 144B, and the substrate 101, and the sacrificial gate structures 200 and the gate spacers 164 may be formed on the active structures.

The active structure may include the sacrificial layers 120, the first to fourth lower channel layers 141A, 142A, 143A, and 144A, and the first to fourth upper channel layers 141B, 142B, 143B, and 144B alternately stacked with each other, and may further include an active region 105 formed such that a portion of the substrate 101 is removed and protrudes to the upper surface of the substrate 101. The active structures may be formed in a line form extending in one direction, for example, the X-direction, and may be spaced apart from each other in the Y-direction.

In a region from which a portion of the substrate 101 is removed, by filling an insulating material and recessing the active region 105 to protrude, a device isolation layer 110 may be formed. An upper surface of the device isolation layer 110 may be formed lower than an upper surface of the active region 105.

The sacrificial gate structures 200 may be a sacrificial structure formed in the region in which the upper gate dielectric layer 162B and the upper gate electrode 163B are disposed on the channel structure 140 through a subsequent process as illustrated in FIG. 2A. The sacrificial gate structures 200 may include first and second sacrificial gate layers 202 and 205, and a mask pattern layer 206 stacked in order. The first and second sacrificial gate layers 202 and 205 may be patterned using a mask pattern layer 206. The first and second sacrificial gate layers 202 and 205 may be an insulating layer and a conductive layer, respectively. For example, the first sacrificial gate layer 202 may include silicon oxide, and the second sacrificial gate layer 205 may include polysilicon. The mask pattern layer 206 may include silicon nitride. The sacrificial gate structures 200 may have a line shape extending in one direction by intersecting the active structures. The sacrificial gate structures 200 may, for example, extend in the Y-direction and may be spaced apart from each other in the X-direction.

Gate spacers 164 may be formed on both sidewalls of sacrificial gate structures 200. The gate spacers 164 may be formed by forming a film having a uniform thickness along the upper and side surfaces of the sacrificial gate structures 200 and the active structures and performing anisotropic etching. The gate spacers 164 may be formed of a low-κ material, and may include, for example, at least one of SiO, SiN, SiCN, SiOC, SiON, and SiOCN.

Figure 11:
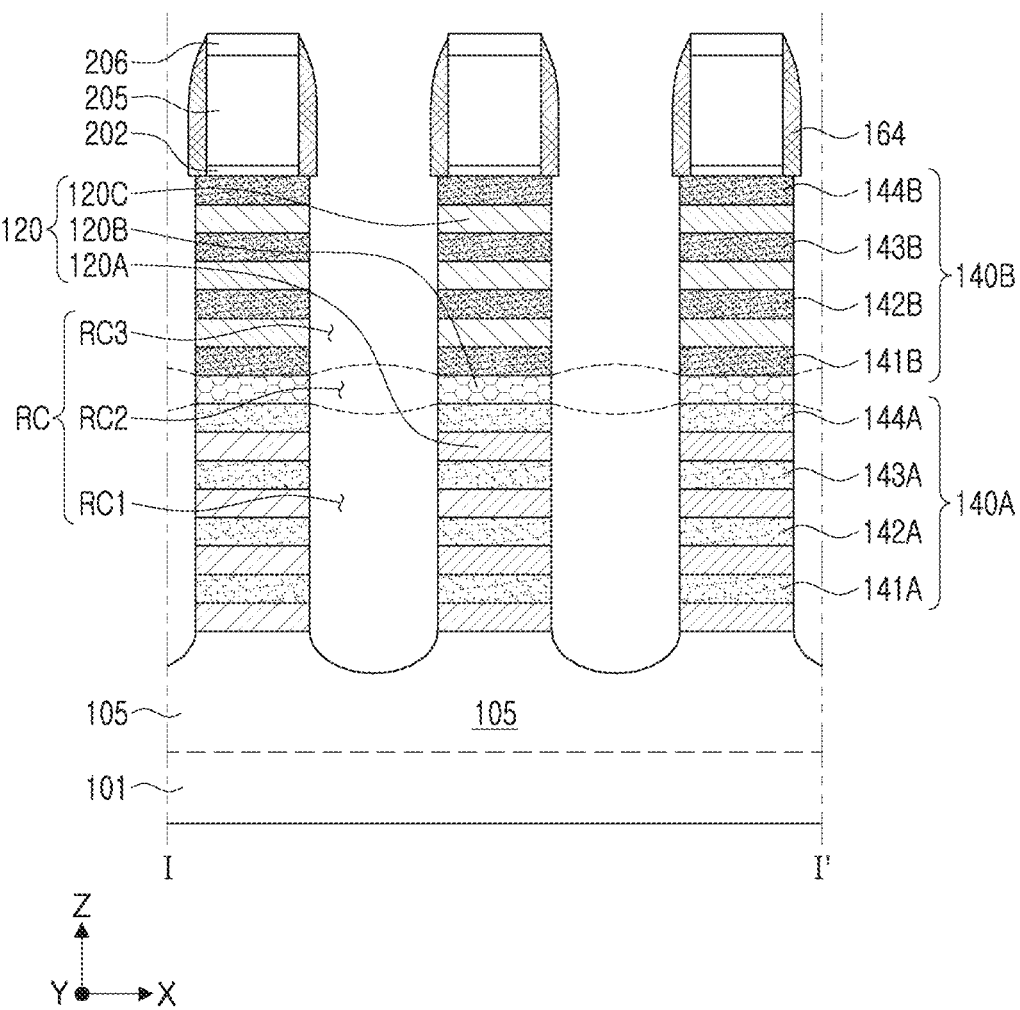

Referring to FIG. 11, by forming the recess regions RC by removing the exposed sacrificial layers 120, the first to fourth lower channel layers 141A, 142A, 143A, and 144A, and the first to fourth upper channel layers 141B, 142B, 143B, and 144B between the sacrificial gate structures 200, the channel structure 140 may be formed.

The exposed sacrificial layers 120, the first to fourth lower channel layers 141A, 142A, 143A, and 144A, and the first to fourth upper channel layers 141B, 142B, 143B, and 144B may be removed using the sacrificial gate structures 200 and the gate spacers 164 as masks. The remaining sacrificial layers 120 may be selectively etched with respect to the channel structure 140 by, for example, a wet etching process, may be removed to a predetermined (or, alternatively, desired or selected) depth from the side surface in the X-direction, and may have side surfaces curved internally. The side surfaces of the sacrificial layers 120, the first to fourth lower channel layers 141A, 142A, 143A, and 144A, and the first to fourth upper channel layers 141B, 142B, 143B, and 144B may be formed to be coplanar with each other in a direction perpendicular to the upper surface of the substrate 101. However, the shapes of the side surfaces of the sacrificial layers 120, the first to fourth lower channel layers 141A, 142A, 143A, and 144A, and the first to fourth upper channel layers 141B, 142B, 143B, and 144B are not limited to the illustrated examples. The remaining side surfaces of the first to fourth lower channel layers 141A, 142A, 143A, and 144A and the first to fourth upper channel layers 141B, 142B, 143B, and 144B may be etched in the X-direction and may have an outwardly curved side surface.

Figure 12:
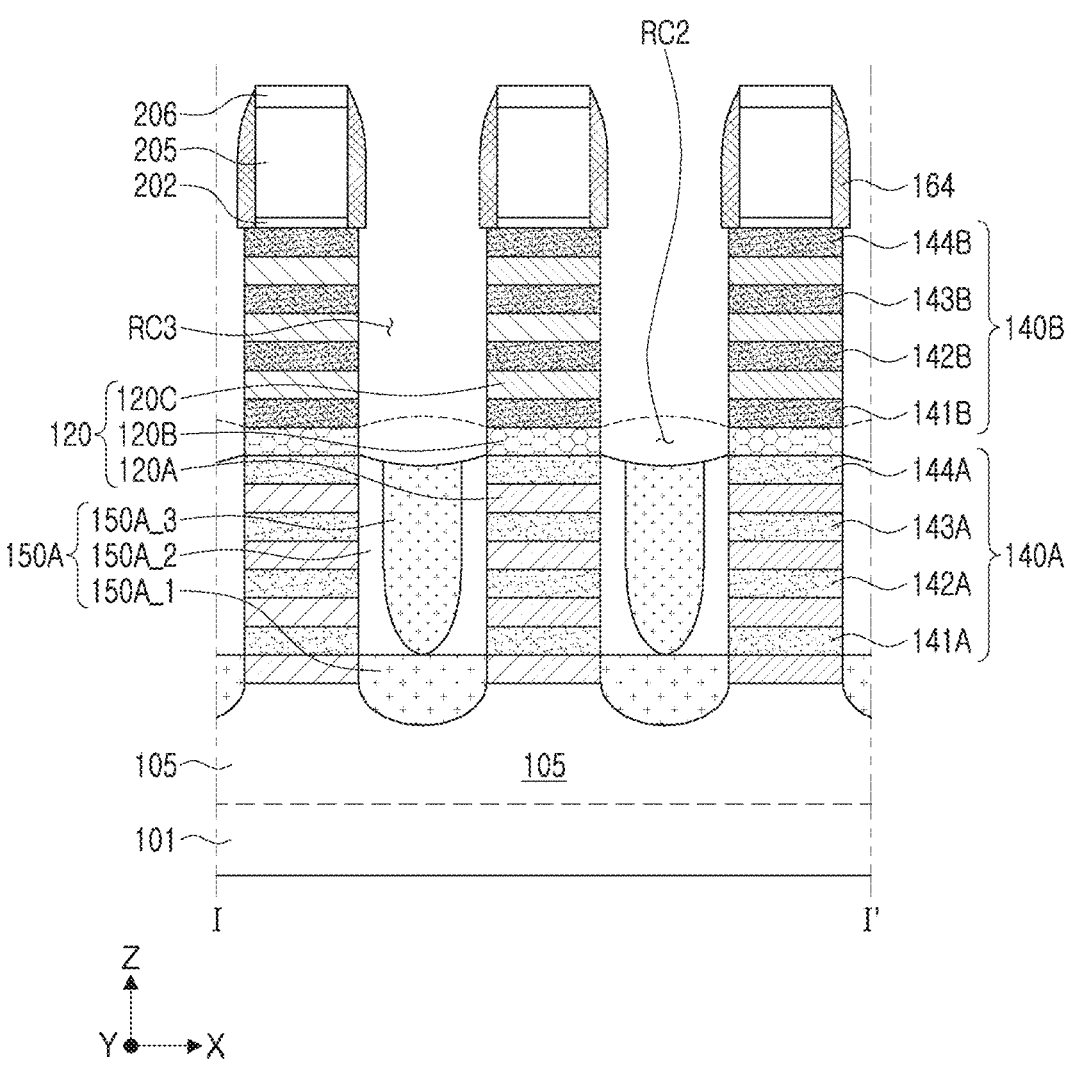

Referring to FIG. 12, the lower source/drain regions 150A may be formed by forming an epitaxial layer in the first recess region RC1.

The lower source/drain regions 150A may be formed by epitaxial growth, and may extend to be in contact with the first to fourth lower channel layers 141A, 142A, 143A, and 144A and the lower sacrificial layers 120A in the first recess region RC1. The upper surface of the lower source/drain regions 150A may have a downwardly curved shape, but some example embodiments thereof are not limited thereto.

The lower source/drain regions 150A may include impurities, which, for example, may be formed by in-situ doping. In some example embodiments, the first lower epitaxial layer 150A_1 may include impurities in a first concentration, the second lower epitaxial layer 150A_2 may include impurities in a second concentration lower than the first concentration, and the third lower epitaxial layer 150A_2 may include impurities at a higher third concentration than the second concentration. The third concentration may be higher than the first concentration, but some example embodiments thereof are not limited thereto.

Figure 13:
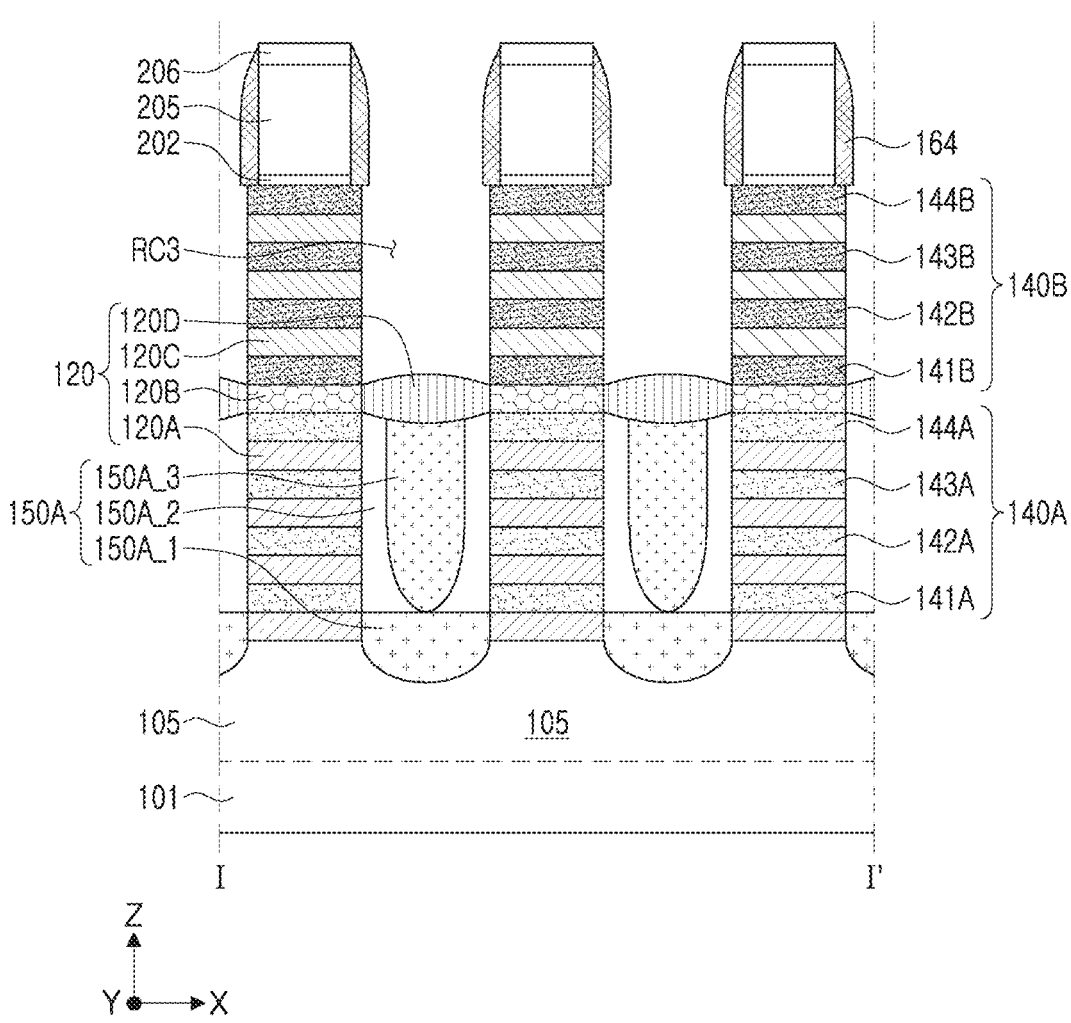

Referring to FIG. 13, in the second recess region RC2, a sacrificial barrier layer 120D may be formed on the lower source/drain regions 150A.

The sacrificial barrier layer 120D may be formed by epitaxial growth. The sacrificial barrier layer 120D may be formed of a material having etching selectivity with respect to the lower sacrificial layers 120A and the upper sacrificial layers 120C. In some example embodiments, the sacrificial barrier layer 120D may include silicon germanium (SiGe). For example, the sacrificial barrier layer 120D may include germanium in a concentration equal or substantially equal to or higher than the concentration of germanium included in the intermediate sacrificial layers 120B. The sacrificial barrier layer 120D may include germanium in a lower concentration than the concentration of germanium included in the lower sacrificial layers 120A to have etching selectivity with respect to the lower sacrificial layers 120A and the upper sacrificial layers 120C, and may include germanium in a higher concentration than the concentration of germanium included in the upper sacrificial layers 120C.

At least a portion of the lower surface or the upper surface of the sacrificial barrier layer 120D may have a (111) crystal orientation, but some example embodiments thereof are not limited thereto.

Figure 14:
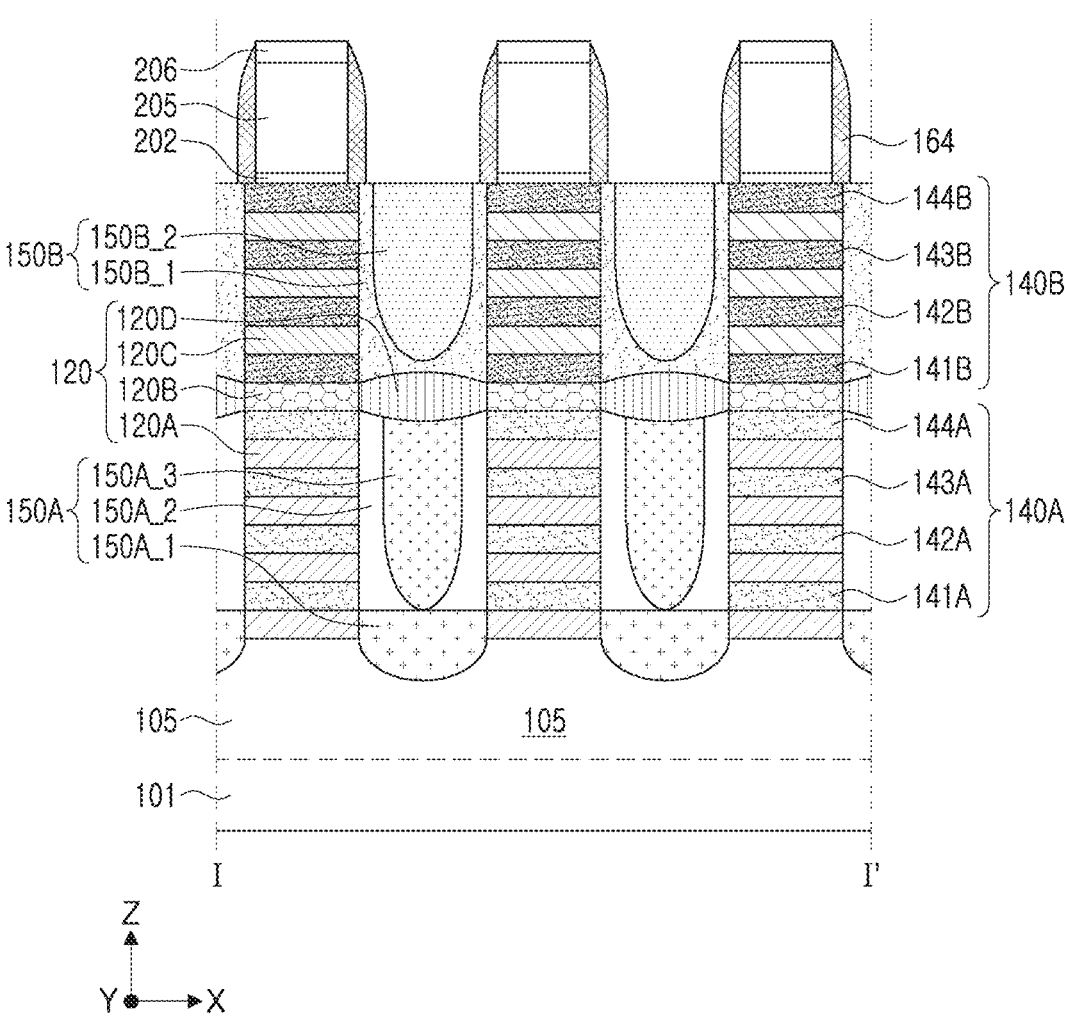

Referring to FIG. 14, in the third recess region RC3, upper source/drain regions 150B may be formed on the sacrificial barrier layer 120D.

The upper source/drain regions 150B may be formed by epitaxial growth, and may extend to be in contact with the first to fourth upper channel layers 141B, 142B, 143B, and 144B and the upper sacrificial layers 120C in the third recess region RC3. The lower surface of the upper source/drain regions 150A may have an upwardly curved shape, but some example embodiments thereof are not limited thereto.

The upper source/drain regions 150B may include impurities by in-situ doping. The first upper epitaxial layer 150B_1 and the second upper epitaxial layer 150B_2 may include silicon germanium (SiGe). In some example embodiments, the second upper epitaxial layer 150B_2 may include germanium in a higher concentration than the concentration of germanium included in the first upper epitaxial layer 150B_1. Since the first upper epitaxial layer 150B_1 has etching selectivity in the subsequent process of removing the intermediate sacrificial layer 120B and the sacrificial barrier layer 120D, the first upper epitaxial layer 150B_1 may include germanium in a lower concentration than the concentration of germanium of each included in the intermediate sacrificial layer 120B and the sacrificial barrier layer 120D.

Figure 15A:
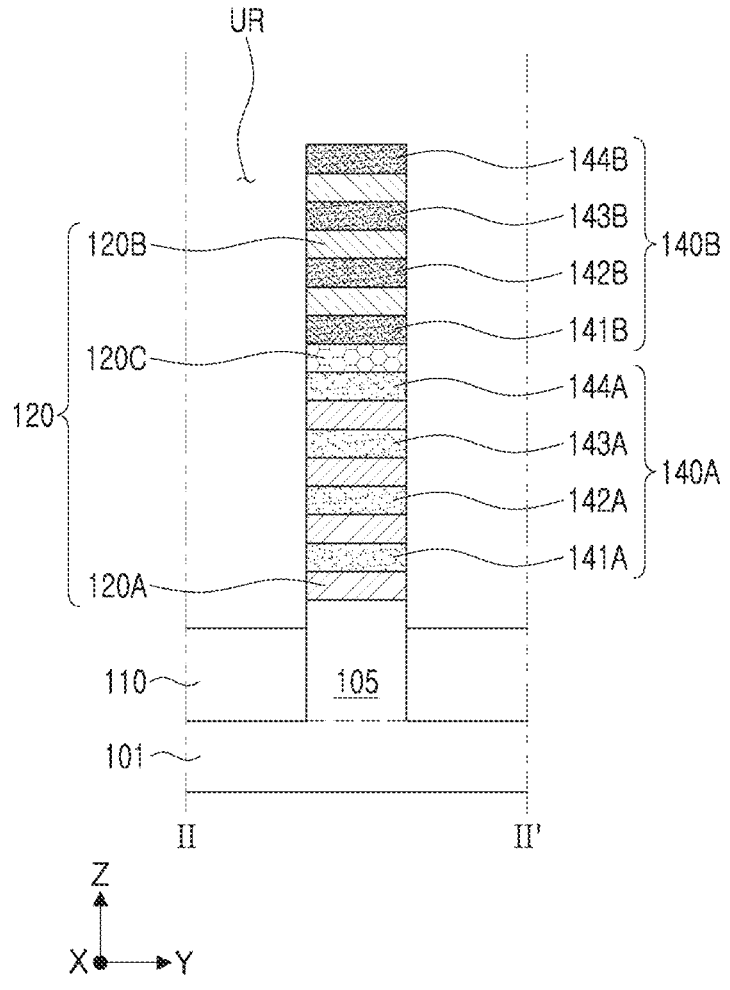
Figure 15B:
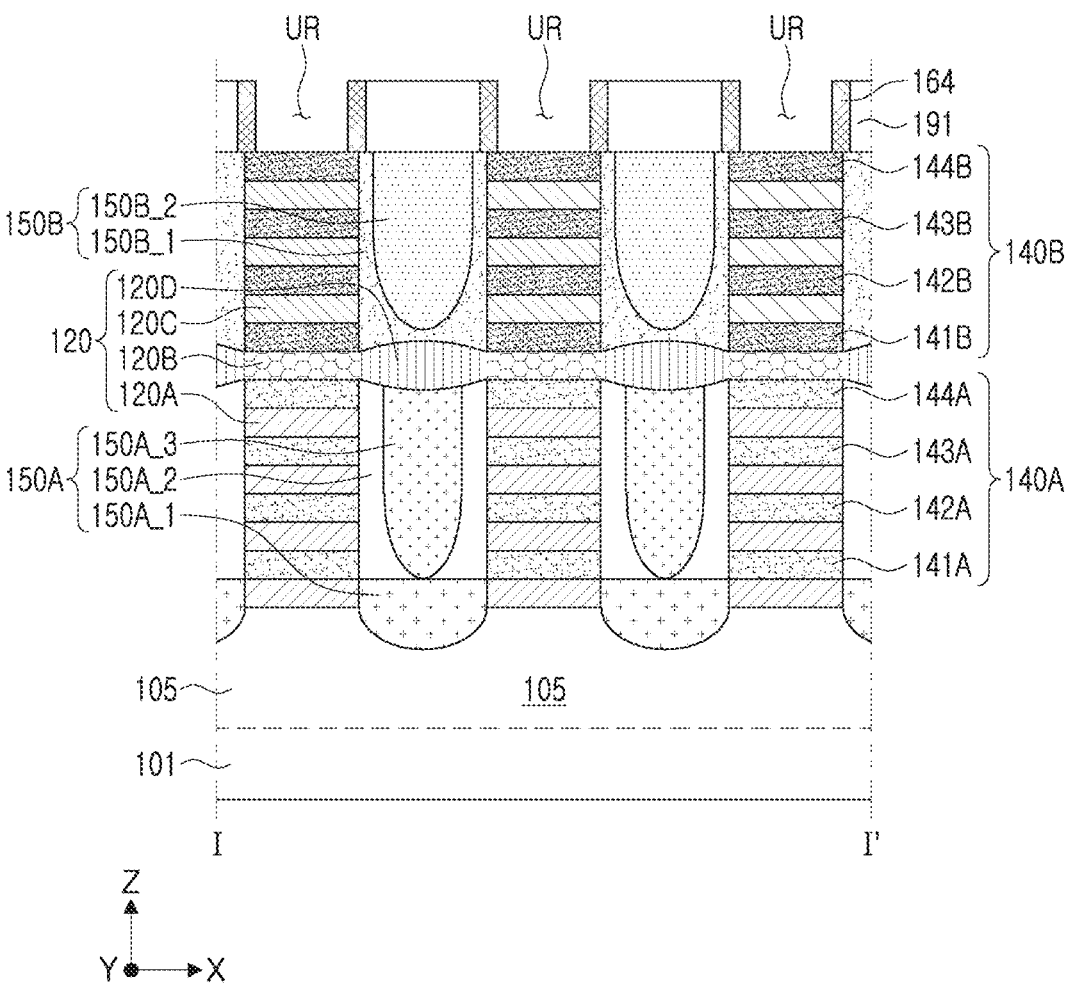

Referring to FIGS. 15A and 15B, a first interlayer insulating layer 191 may be formed and the sacrificial gate structures 200 may be removed.

The first interlayer insulating layer 191 may be formed by forming an insulating film covering the sacrificial gate structures 200 and the upper source/drain regions 150B and performing a planarization process.

The sacrificial gate structures 200 may be selectively removed with respect to the gate spacers 164, the first interlayer insulating layer 191, the first to fourth lower channel layers 141A, 142A, 143A, and 144A, and the first to fourth upper channel layers 141B, 142B, 143B, and 144B. Accordingly, the upper gap regions UR may be formed by removing the sacrificial gate structures 200.

Figure 16A:
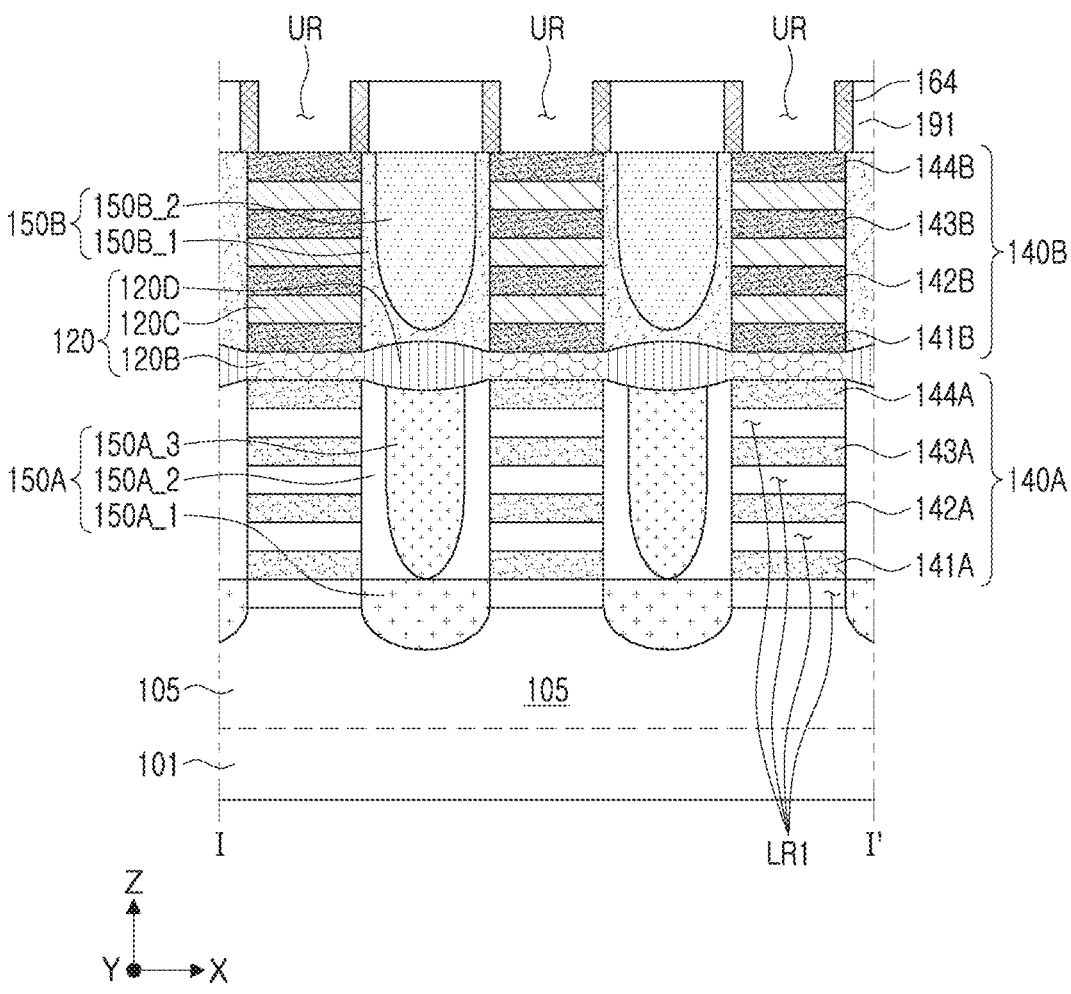
Figure 16B:
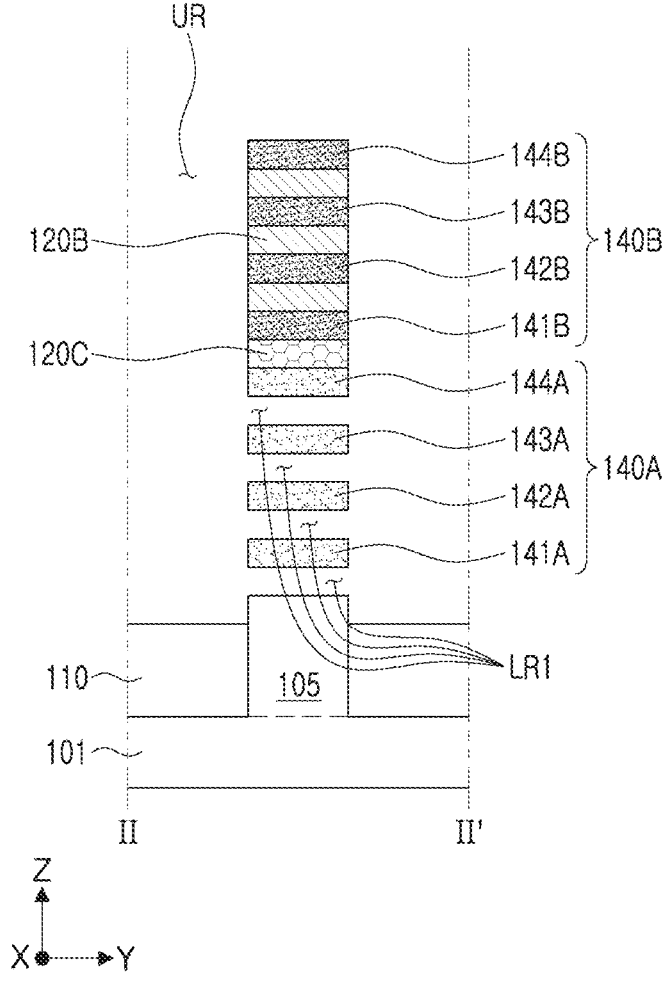

Referring to FIGS. 16A and 16B, the first lower gap regions LR1 may be formed by removing the lower sacrificial layers 120A.

Since the lower sacrificial layers 120A may have etching selectivity with respect to the intermediate sacrificial layer 120B, the upper sacrificial layers 120C, the first to fourth lower channel layers 141A, 142A, 143A, and 144A, and the first to fourth upper channel layers 141B, 142B, 143B, and 144B, the lower sacrificial layers 120A may be selectively etched. For example, when the lower sacrificial layers 120A include silicon germanium (SiGe) and the first to fourth lower channel layers 141A, 142A, 143A, and 144A include silicon (Si), the lower sacrificial layers 120A may be selectively removed by performing a wet etching process using peracetic acid as an etchant.

Figure 17A:
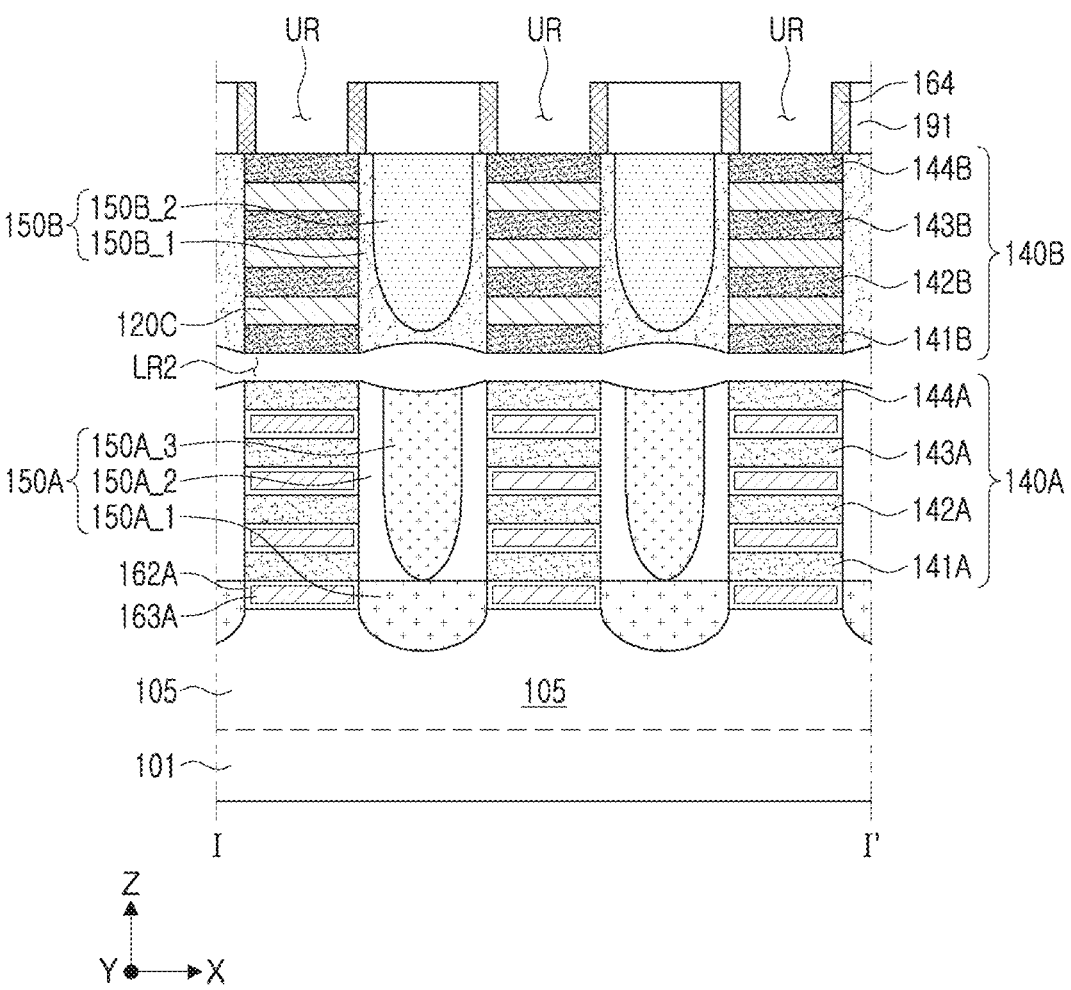
Figure 17B:
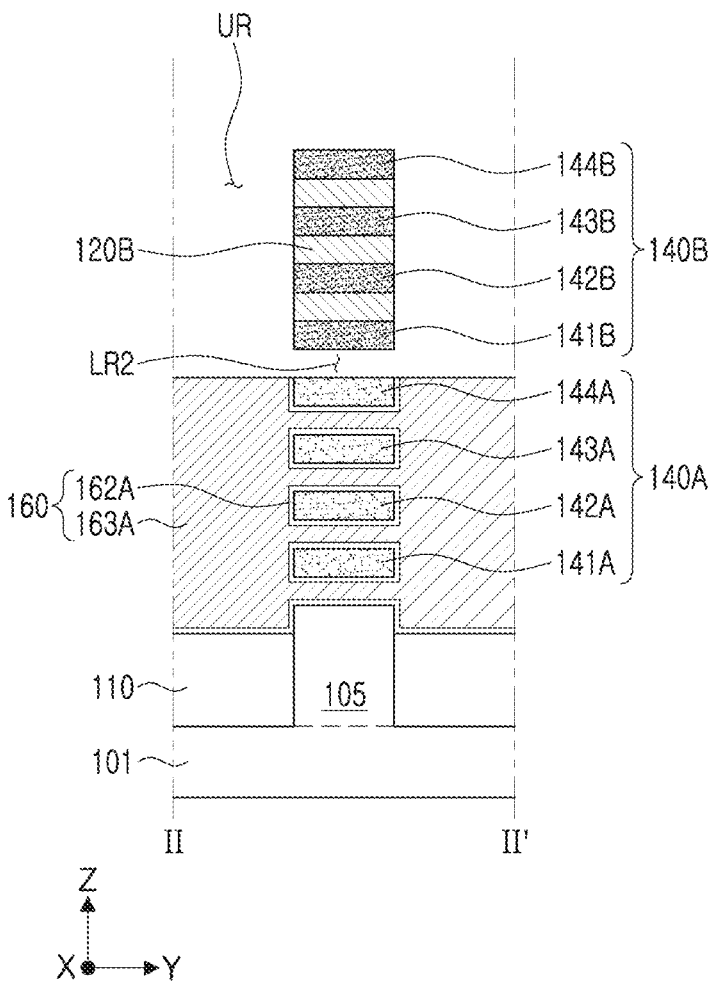

Referring to FIGS. 17A and 17B, a lower gate structure 160A may be formed in the first lower gap regions LR1. Second lower gap regions LR2 may be formed by removing the intermediate sacrificial layer 120B and the sacrificial barrier layer 120D.

The lower gate dielectric layer 162A may be formed to conformally cover internal surfaces of the first lower gap regions LR1. The lower gate electrode 163A may be formed to completely fill the first lower gap regions LR1. Accordingly, a lower gate structure 160A including a lower gate dielectric layer 162A and a lower gate electrode 163A may be formed.

Since the intermediate sacrificial layer 120B and the sacrificial barrier layer 120D may have etching selectivity with respect to the lower source/drain regions 150A, the upper source/drain regions 150B, the upper sacrificial layers 120C, the first to fourth lower channel layers 141A, 142A, 143A, and 144A, and the first to fourth upper channel layers 141B, 142B, 143B, and 144B, the intermediate sacrificial layer 120B and the sacrificial barrier layer 120D may be selectively etched. Accordingly, the second lower gap regions LR2 may be formed. In this case, the first interlayer insulating layer 191 and the gate spacers 164 may support the lower channel layers 140A and the upper channel layers 140B.

Figure 18A:
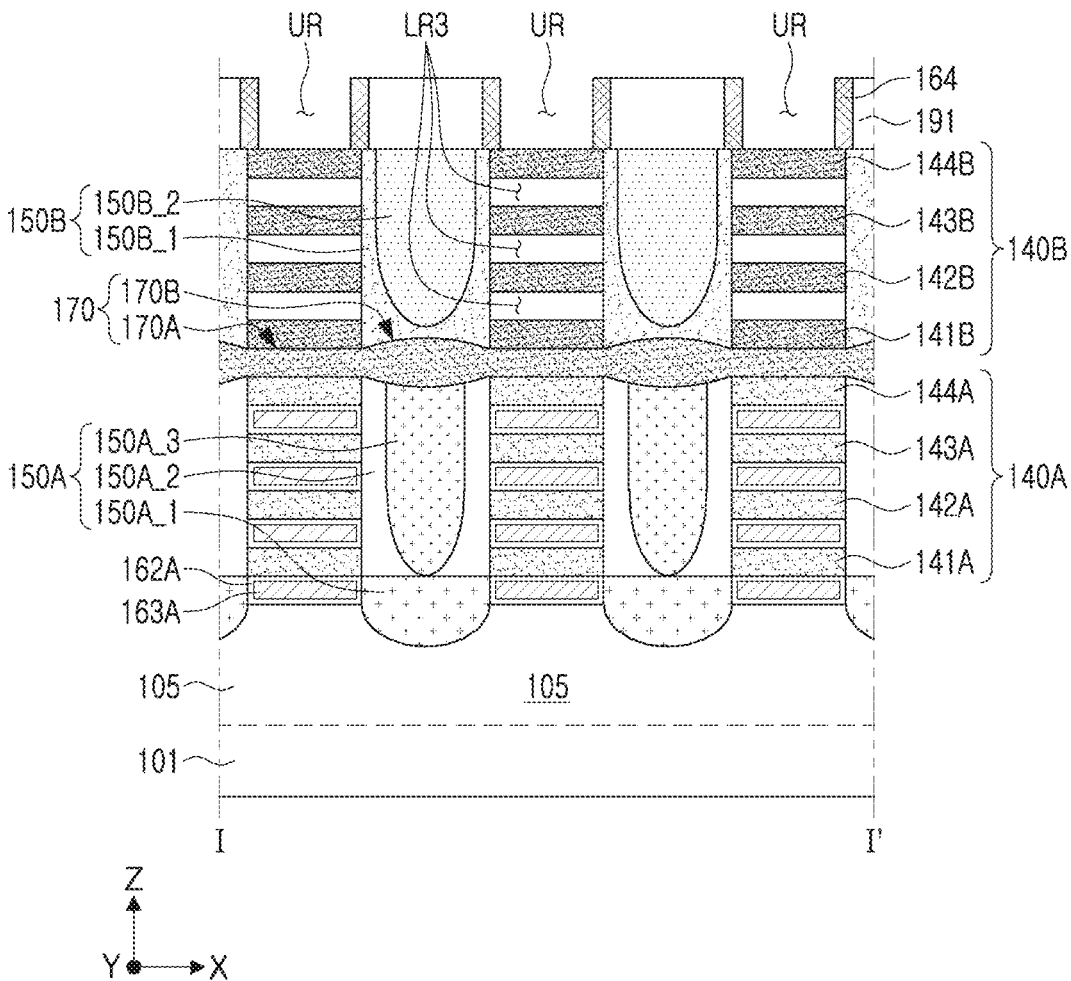
Figure 18B:
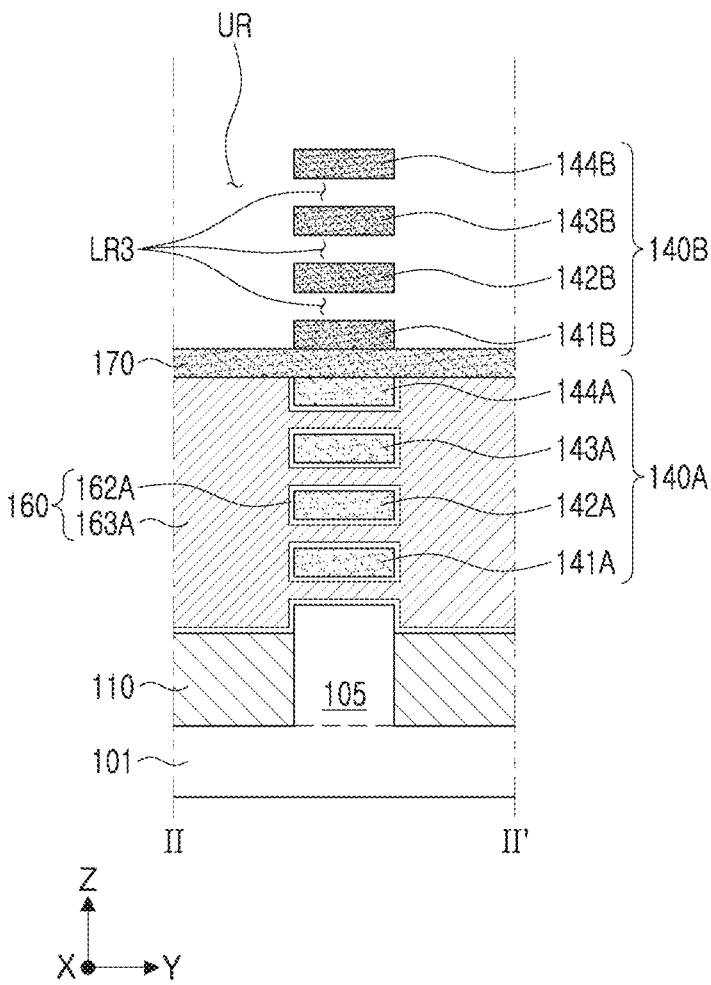

Referring to FIGS. 18A and 18B, a barrier layer 170 may be formed in the second lower gap regions LR2. third lower gap regions LR3 may be formed by removing the upper sacrificial layers 120C.

A barrier layer 170 may be formed in the second lower gap regions LR2 such that the lower source/drain regions 150A and the upper source/drain regions 150B may not be in contact with each other. The barrier layer 170 may isolate the lower source/drain regions 150A and the upper source/drain regions 150B from each other. When the second lower gap regions LR2 are not completely filled, an air gap 170V may be formed as in the semiconductor device 100B in FIG. 4.

Figure 19A:
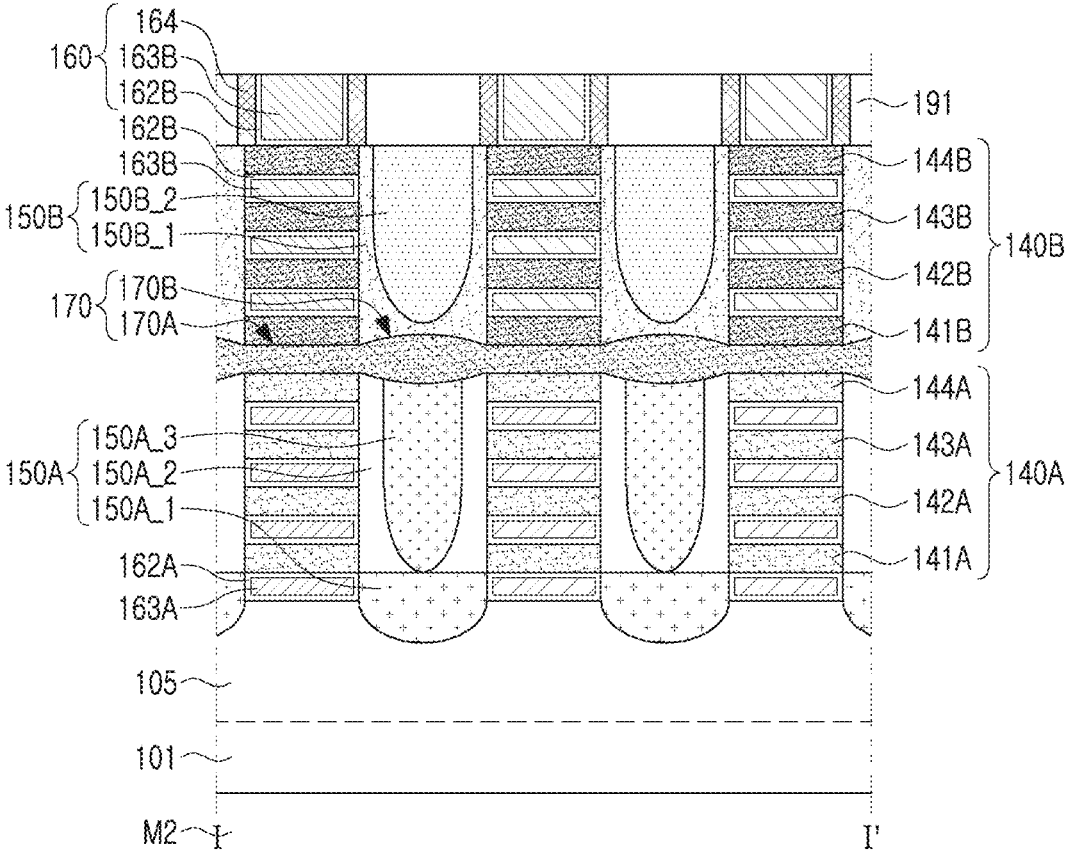
Figure 19A:
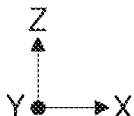
Figure 19B:
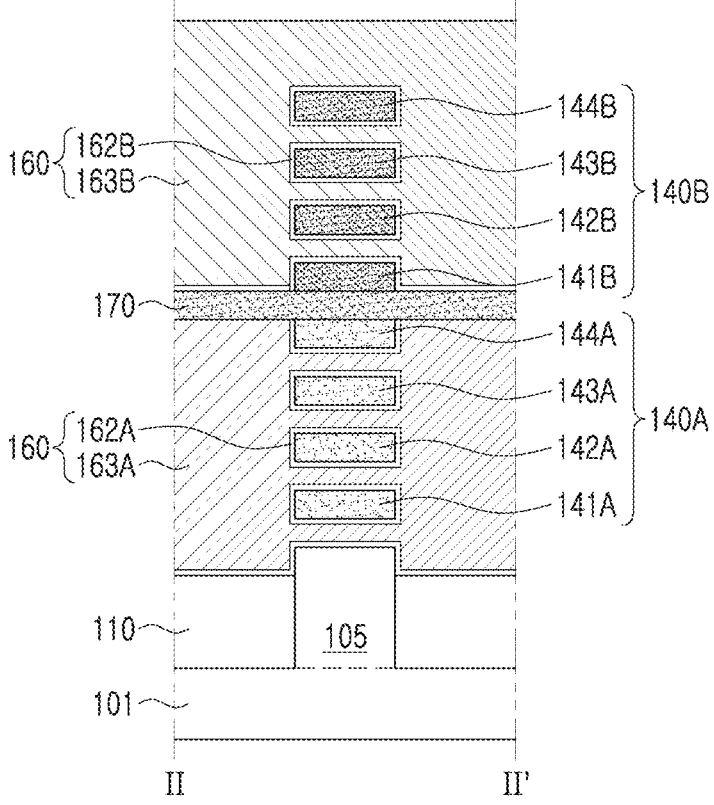
Figure 19B:
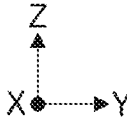

Referring to FIGS. 19A and 19B, an upper gate structure 160B may be formed in the upper gap regions UR and the third lower gap regions LR3.

The upper gate dielectric layer 162B may be formed to conformally cover internal surfaces of the third lower gap regions LR3. The upper gate electrode 163B may be formed to completely fill the upper gap regions UR and the third lower gap regions LR3. Accordingly, an upper gate structure 160B including an upper gate dielectric layer 162B, an upper gate electrode 163B, and gate spacers 164 may be formed.

Figure 20A:
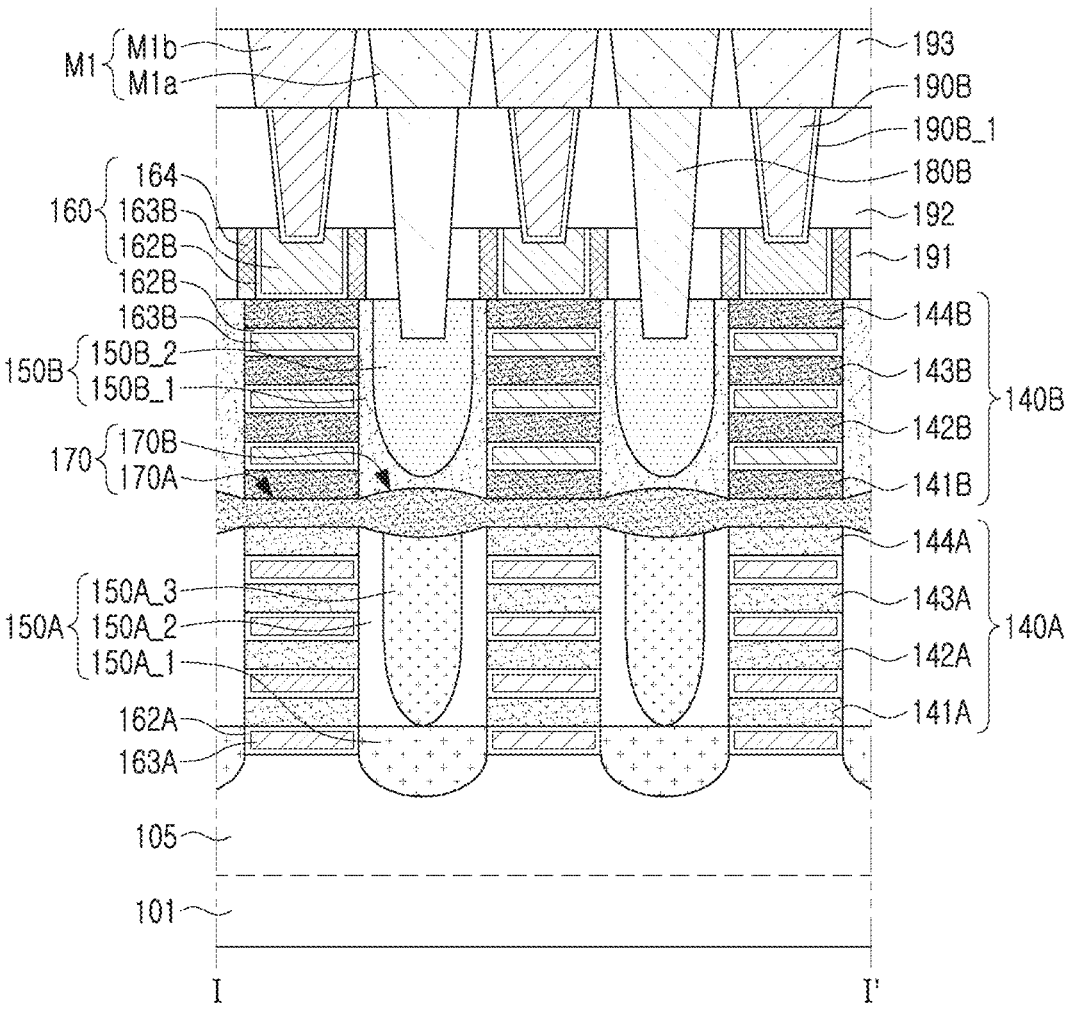
Figure 20B:
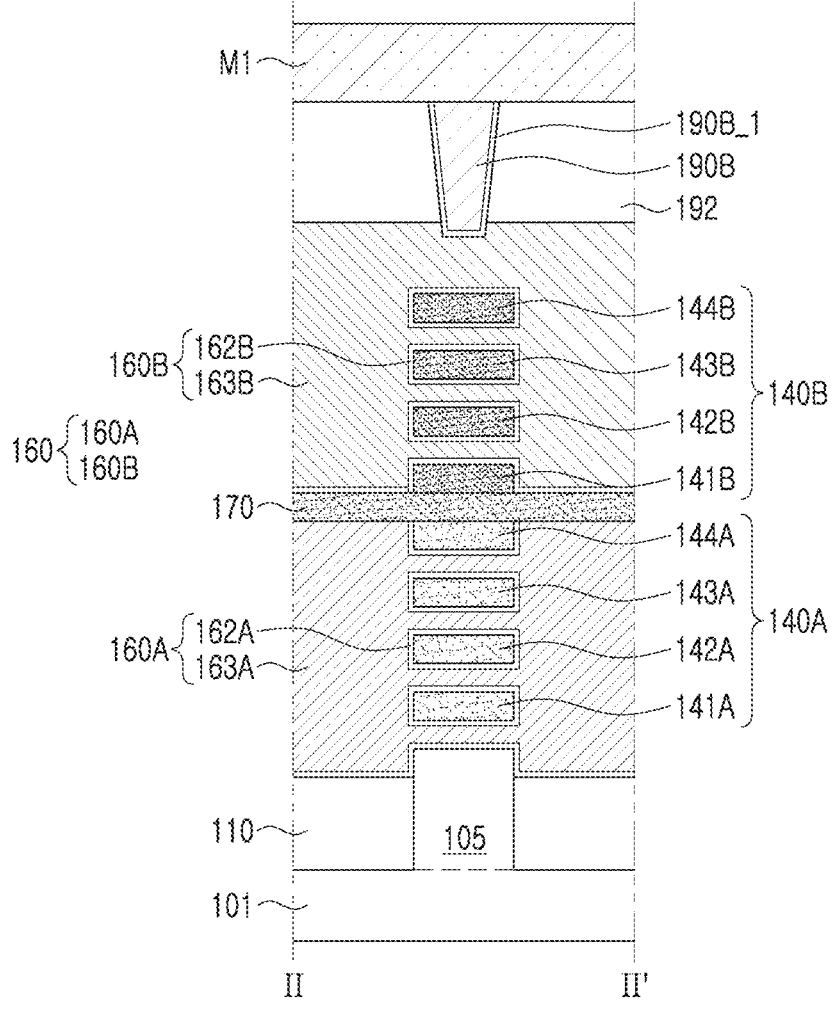
Figure 20B:
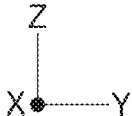

Referring to FIGS. 20A and 20B, an upper contact structure 180B, an upper gate contact structure 190B, and first wiring M1 may be formed.

A second interlayer insulating layer 192 and a third interlayer insulating layer 193 covering the first interlayer insulating layer 191 and the upper gate structure 160B may be formed.

An upper contact structure 180B may be formed to penetrate through at least a portion of the first and second interlayer insulating layers 191 and 192 and to be in contact with the upper source/drain regions 150B.

An upper gate contact structure 190B may be formed to penetrate through at least a portion of the second interlayer insulating layer 192 and be in contact with the upper gate electrode 163B.

By forming a first upper metal wiring M1a and a second upper metal wiring M1b to penetrate through at least a portion of the third interlayer insulating layer 193 and the third interlayer insulating layer 193 on the upper contact structure 180B and the upper gate contact structure 190B and to be in contact with the upper contact structure 180B and the upper gate contact structure 190B, respectively, the first upper metal wiring M1 may be formed.

Figure 21A:
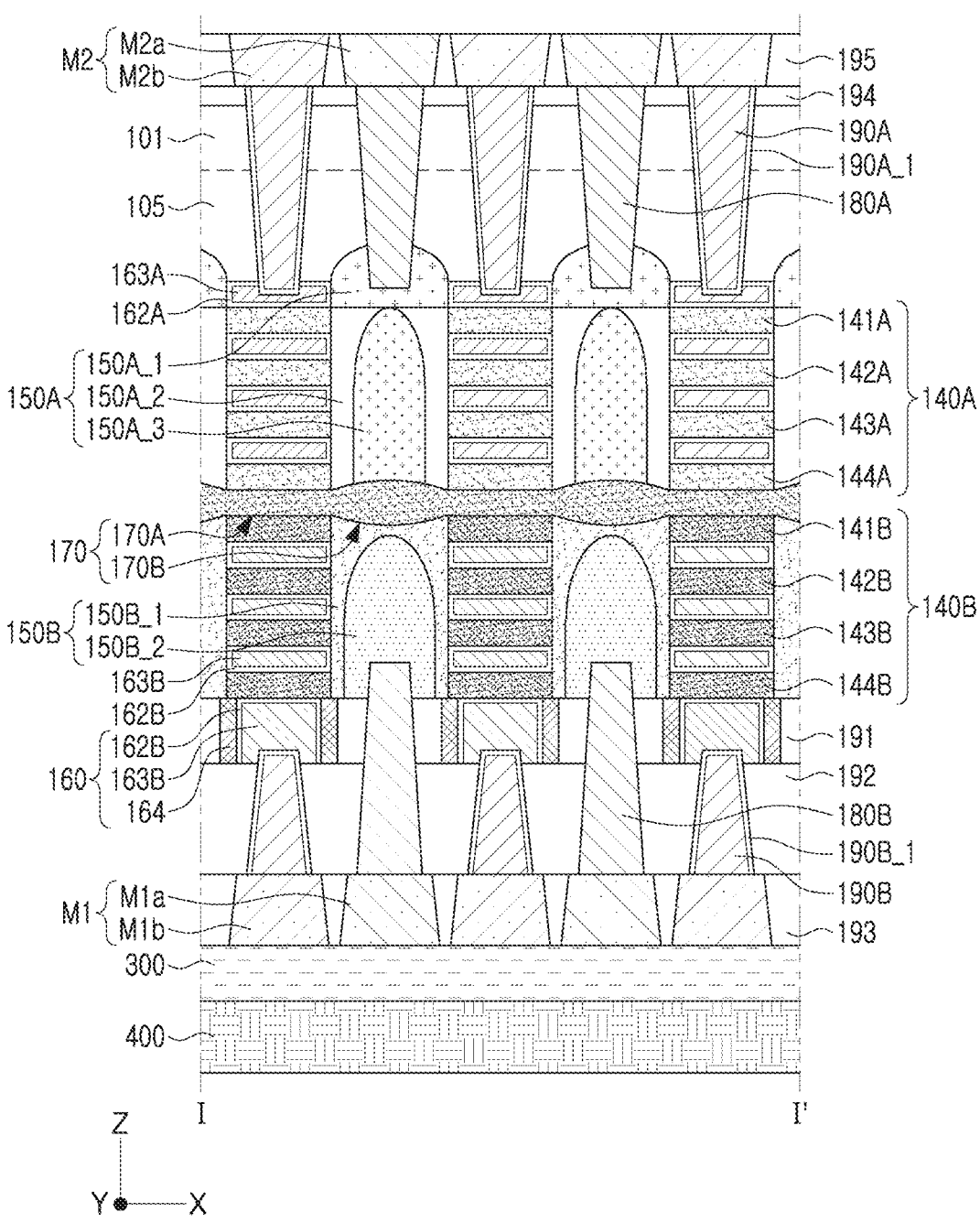
Figure 21B:
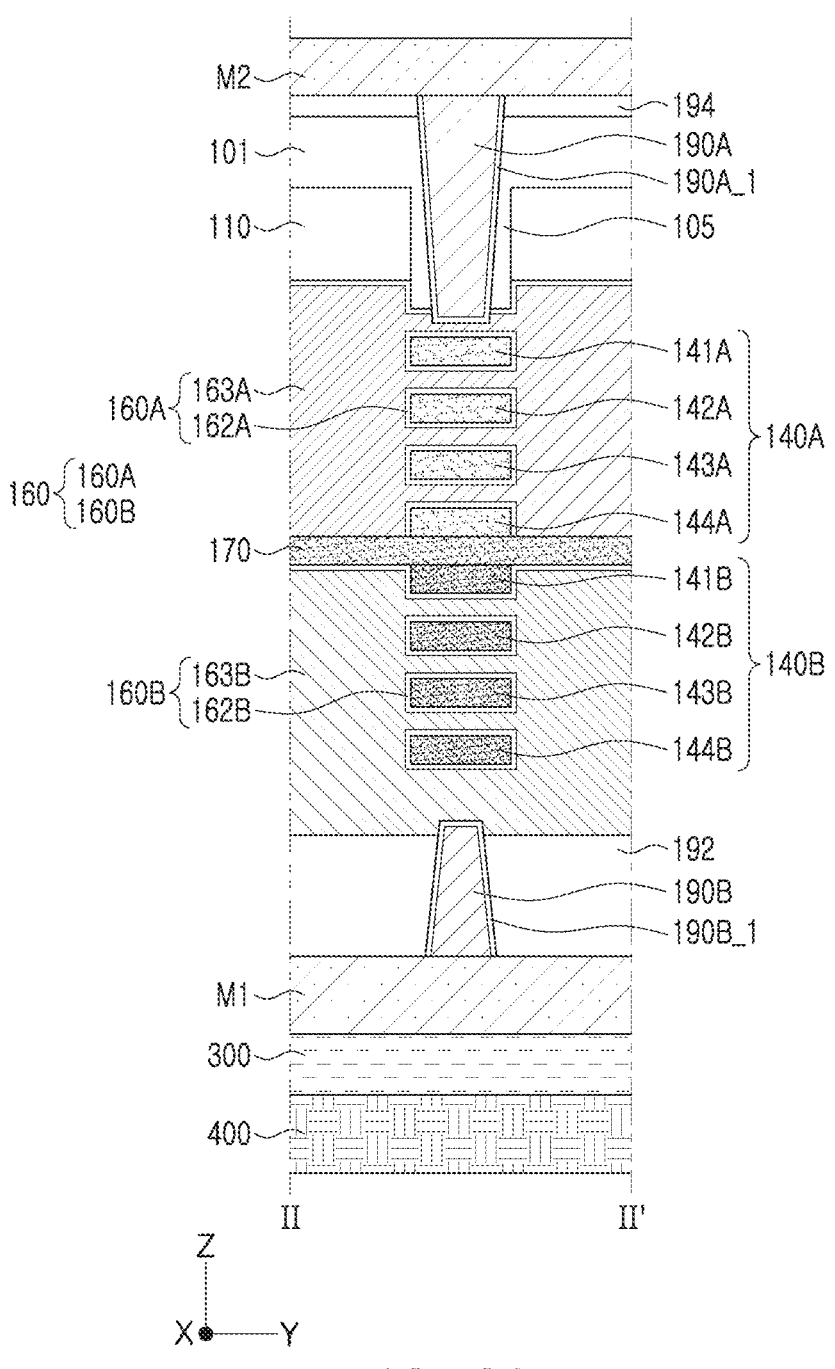

Referring to FIGS. 21A and 21B, a lower contact structure 180A, a lower gate contact structure 190A, and a second wiring M2 may be formed.

The bonding layer 300 and the base substrate 400 may be formed on the first metal wiring M1, and the lower contact structure 180A penetrating through at least a portion of the substrate 101 and in contact with the lower source/drain regions 150A may be formed.

A lower gate contact structure 190A may be formed to penetrate through at least a portion of the substrate 101 and be in contact with the lower gate electrode 163A.

A fourth interlayer insulating layer 194 may be formed on the substrate 101, and a first lower metal wiring M2a and a second lower metal wiring M2b may be formed to be in contact with the lower contact structure 180A and the lower gate contact structure 190A, respectively, thereby forming the second wiring M2.

Referring to FIGS. 2A and 2B together, by removing the bonding layer 300 and the base substrate 400, the semiconductor device 100 may be provided.

According to some example embodiments, in the semiconductor device, by disposing a barrier layer between the lower and upper structures, the lower and upper source/drain regions may be isolated from each other, and the lower and upper source/drain regions may have different conductivity-types. Accordingly, the upper contact structure may be in contact with the upper surface of the upper source/drain region, and the lower contact structure may be in contact with the lower surface of the lower source/drain region, thereby providing a semiconductor device having relatively high integration density.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about"

or "substantially," it will be understood that these values and shapes should be construed as including a manufacturing or operational tolerance (e.g., ±10%) around the stated numerical values or shapes.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
a lower structure;
a barrier layer on the lower structure; and
an upper structure on the barrier layer,
the lower structure including
    lower source/drain regions spaced apart from each other in a first direction;
    lower active layers spaced apart from each other in a vertical direction, between the lower source/drain regions, and connected to the lower source/drain regions; and
    a lower gate structure extending in a second direction perpendicular to the first direction and including portions below each of the lower active layers,
the upper structure including
    upper source/drain regions spaced apart from each other in the first direction and vertically overlapping the lower source/drain regions;
    upper active layers spaced apart from each other in the vertical direction, between the upper source/drain regions, connected to the upper source/drain regions, and vertically overlapping the lower active layers; and
    an upper gate structure extending in the second direction, including portions on each of the upper active layers, and vertically overlapping the lower gate structure, and
an uppermost lower active layer of the lower active layers and a lowermost upper active layer of the upper active layers being in contact with the barrier layer define a first portion of the barrier layer,
the lower source/drain regions and the upper source/drain regions being in contact with the barrier layer define a second portion of the barrier layer,
a thickness of the second portion of the barrier layer is greater than a thickness of the first portion of the barrier layer,
a bottommost surface of the second portion being curved outward towards the lower source/drain regions.

2. The semiconductor device of claim 1, wherein
the lower active layers include a lowermost lower active layer, the uppermost lower active layer, and one or more first lower active layers between the lowermost lower active layer and the uppermost lower active layer,
the upper active layers include the lowermost upper active layer, an uppermost upper active layer, and one or more first upper active layers between the lowermost upper active layer and the uppermost upper active layer,
the lower gate structure surrounds a lower surface, an upper surface, and a side surface of each of the one or more first lower active layers and the lowermost lower active layer, and covers a lower surface and a side surface of the uppermost lower active layer, in the second direction, and
the upper gate structure surrounds a lower surface, an upper surface, and a side surface of each of the one or more first upper active layers and the uppermost upper active layer, and covers an upper surface and a side surface of the lowermost upper active layer, in the second direction.

3. The semiconductor device of claim 1, wherein the upper source/drain regions and the lower source/drain regions have different conductivity-types.

4. The semiconductor device of claim 1, wherein at least a portion of a surface in contact with the barrier layer and the upper source/drain regions or a surface in contact with the lower source/drain regions has a (111) crystal orientation.

5. The semiconductor device of claim 1, wherein at least a portion of an uppermost surface of the second portion of the barrier layer has a curved shape outward towards the upper sou/drain regions.

6. The semiconductor device of claim 1, further comprising:

internal spacers between the lower gate structure and the lower source/drain regions or between the upper gate structure and the upper source/drain regions in the first direction.

7. The semiconductor device of claim 1, wherein a lowermost end of the lower source/drain regions is on a level lower than a level of a lowermost surface of the lower gate structure.

8. The semiconductor device of claim 1, wherein, among portions of the lower gate structure below the lower active layers, respectively, a thickness of a portion of the lower gate structure below a lowermost lower active layer among the lower active layers is greater than a thickness of each of the other portions of the lower structure.

9. The semiconductor device of claim 1, wherein each of the upper source/drain regions includes:

a first upper epitaxial layer on the barrier layer, extending to be in contact with the upper active layers, and including germanium (Ge) of a first concentration; and a second upper epitaxial layer on the first upper epitaxial layer and including germanium (Ge) of a second concentration higher than the first concentration, and the second upper epitaxial layer is spaced apart from the barrier layer and the upper active layers by the first upper epitaxial layer.

10. The semiconductor device of claim 1, wherein each of the lower source/drain regions includes:

a first lower epitaxial layer including a first concentration of impurities;

a second lower epitaxial layer on the first lower epitaxial layer, extending to be in contact with the lower active layers, and including impurities of a second concentration lower than the first concentration; and a third lower epitaxial layer in contact with the first lower epitaxial layer, on an internal surface of the second lower epitaxial layer, and including impurities of a third concentration higher than the second concentration, and the third lower epitaxial layer is spaced apart from the lower active layers by the second lower epitaxial layer.

11. The semiconductor device of claim 1, further comprising:

an upper contact structure on the upper source/drain regions and connected to the upper source/drain regions; and a lower contact structure below the lower source/drain regions and connected to the lower source/drain regions.

12. The semiconductor device of claim 11, further comprising:

an upper gate contact structure on the upper gate structure and electrically connected to a gate electrode of the upper gate structure; and a lower gate contact structure below the lower gate structure and electrically connected to a lower gate electrode of the lower gate structure.

13. A semiconductor device, comprising:

a first structure;

a barrier layer on the first structure; and a second structure on the barrier layer, the first structure including first source/drain regions spaced apart from each other in a first direction;

first channel layers spaced apart from each other in a vertical direction, between the first source/drain regions, and connected to the first source/drain regions; and a first gate structure extending in a second direction perpendicular to the first direction and including portions below the first channel layers, respectively, the second structure including second source/drain regions spaced apart from each other in the first direction;

second channel layers spaced apart from each other in the vertical direction, between the second source/drain regions, and connected to the second source/drain regions; and a second gate structure extending in the second direction and including portions on the second channel layers, respectively, the barrier layer including a first portion defined by contact with an uppermost first channel layer among the first channel layers and a lowermost second channel layer among the second channel layers, and a second portion extending from the first portion and defined by contact with the first source/drain regions and the second source/drain regions, a lowermost surface of the second portion having a curved shape outward toward the first source/drain regions, and a thickness of the second portion of the barrier layer is greater than a thickness of the first portion of the barrier layer.

14. The semiconductor device of claim 13, further comprising:

an air gap between the first source/drain regions and the second source/drain regions and on a side surface of the second portion of the barrier layer.

15. The semiconductor device of claim 13, wherein an uppermost surface of the second portion of the barrier layer has an upwardly curved shape.

16. The semiconductor device of claim 13, wherein the second source/drain regions include:

a first upper epitaxial layer on the barrier layer, extending to be in contact with the second channel layers, and including germanium (Ge) of a first concentration; and a second upper epitaxial layer on the first upper epitaxial layer and including germanium (Ge) of a second concentration higher than the first concentration, the second upper epitaxial layer is spaced apart from the barrier layer and the second channel layers by the first upper epitaxial layer.

17. The semiconductor device of claim 13, further comprising:

a first contact structure below the first source/drain regions and in contact with the first source/drain regions;

a second contact structure on the second source/drain regions and in contact with the second source/drain regions.

18. A semiconductor device, comprising:

lower channel layers and upper channel layers stacked in a vertical direction;

lower source/drain regions spaced apart from each other on a first level;

upper source/drain regions spaced apart from each other on a second level higher than the first level;

lower channel layers between the lower source/drain regions and spaced apart from each other in a vertical direction;

upper channel layers between the upper source/drain regions and spaced apart from each other in the vertical direction;

a barrier layer between an uppermost lower channel layer of the lower channel layers and a lowermost upper channel layer of the upper channel layers, and between the lower source/drain regions and the upper source/ drain regions;

a lower gate structure below the barrier layer and extending by covering an upper surface, a side surface, and a lower surface of at least one of the lower channel layers;

an upper gate structure on the barrier layer and extending by covering an upper surface, a side surface, and a lower surface of at least one of the upper channel layers;

a lower contact structure below the lower source/drain regions and electrically connected to the lower source/ drain regions;

an upper contact structure on the upper source/drain regions and electrically connected to the upper source/ drain regions, the lower channel layers and the upper channel layers being in contact with the barrier layer define a first portion of the barrier layer, the lower source/drain regions and the upper source/drain regions being in contact with the barrier layer define a second portion of the barrier layer, a thickness of the second portion of the barrier layer is greater than a thickness of the first portion of the barrier layer, a bottommost surface of the second portion being curved outward towards the lower source/drain regions.

19. The semiconductor device of claim 1, wherein the first portion and the second portion are integral and a continuous layer.

\* \* \* \* \*